(12) United States Patent
Uchida

(10) Patent No.: US 6,982,436 B2
(45) Date of Patent: Jan. 3, 2006

(54) LIGHT-EMITTING DEVICE, METHOD OF MANUFACTURING THE SAME, AND ELECTRONIC APPARATUS

(75) Inventor: Masahiro Uchida, Chino (JP)

(73) Assignee: Seiko Epson Corporation, Tokyo (JP)

( * ) Notice: Subject to any disclaimer, the term of this patent is extended or adjusted under 35 U.S.C. 154(b) by 19 days.

(21) Appl. No.: 10/615,847

(22) Filed: Jul. 10, 2003

(65) Prior Publication Data

US 2004/0061121 A1    Apr. 1, 2004

(30) Foreign Application Priority Data

Jul. 23, 2002    (JP)    ............... 2002-214298

(51) Int. Cl.
*H01L 33/00*    (2006.01)
*H01L 21/00*    (2006.01)
(52) U.S. Cl. ............... 257/98; 257/89; 438/35; 438/99
(58) Field of Classification Search ............ 257/98, 257/89, 91, 40, 750; 438/35, 99, 47
See application file for complete search history.

(56) References Cited

U.S. PATENT DOCUMENTS 5,554,911 A * 9/1996 Nakayama et al. ......... 313/504
6,124,024 A    9/2000 Hosokawa et al.
6,639,250 B1 * 10/2003 Shimoda et al. ............. 257/98
2004/0061121 A1 * 4/2004 Uchida ........................ 257/82

FOREIGN PATENT DOCUMENTS

| JP | A-57-51781 | 3/1982 |
| JP | A-59-194393 | 11/1984 |
| JP | A-63-70257 | 3/1988 |
| JP | A-63-175860 | 7/1988 |
| JP | A-2-135359 | 5/1990 |
| JP | A-2-135361 | 5/1990 |
| JP | A-2-209988 | 8/1990 |
| JP | A-3-37992 | 2/1991 |
| JP | A-3-152184 | 6/1991 |
| JP | A-11-40358 | 2/1999 |

* cited by examiner

*Primary Examiner*—Mark V. Prenty
(74) *Attorney, Agent, or Firm*—Oliff & Berridge, PLC

(57) ABSTRACT

The invention enhances or optimizes chromaticity of light in a light-emitting device that includes light-emitting layers. A light-emitting device includes light-emitting layers and electrode layers. The light extracted from the light-emitting device includes the light, which is incident from the light-emitting layers to the electrode layers. The film thicknesses of the electrode layers (transparent layers) are set so that the chromaticity of the extracted light approaches a predetermined value.

9 Claims, 12 Drawing Sheets

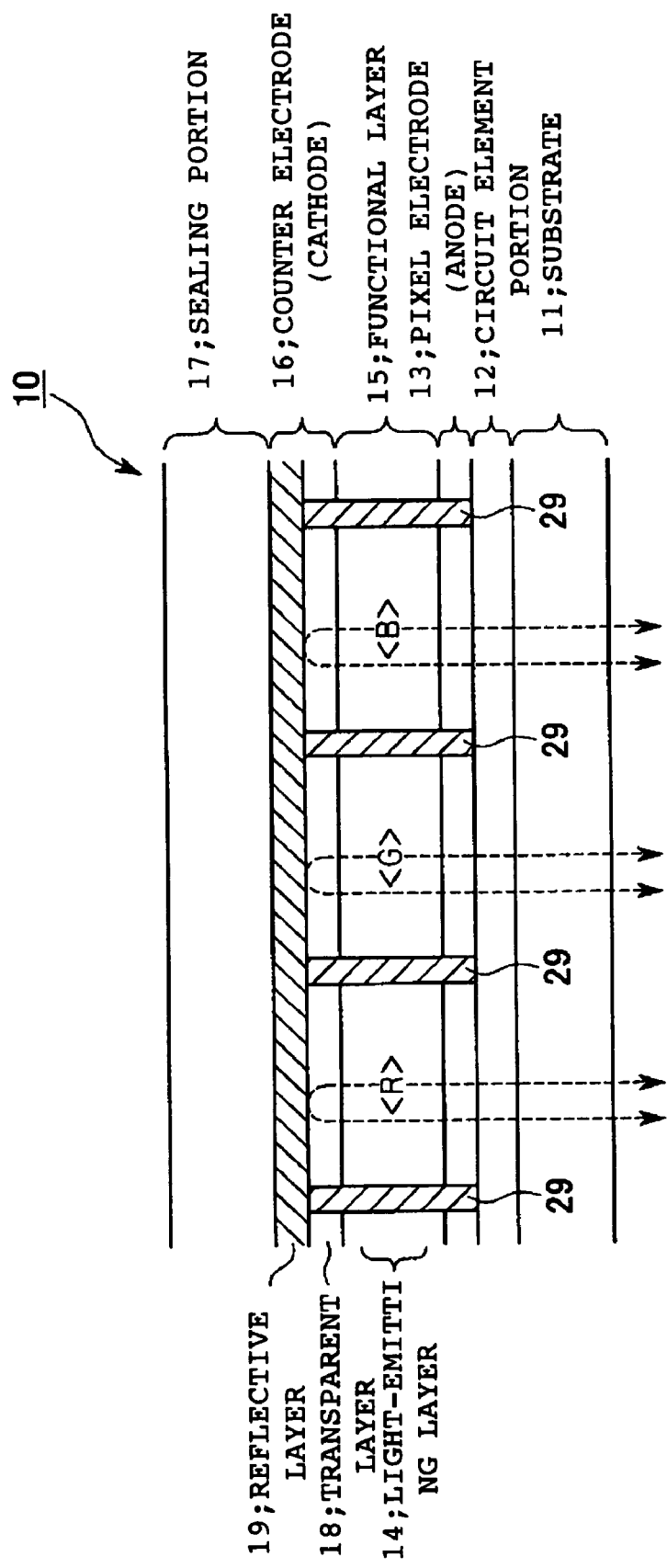

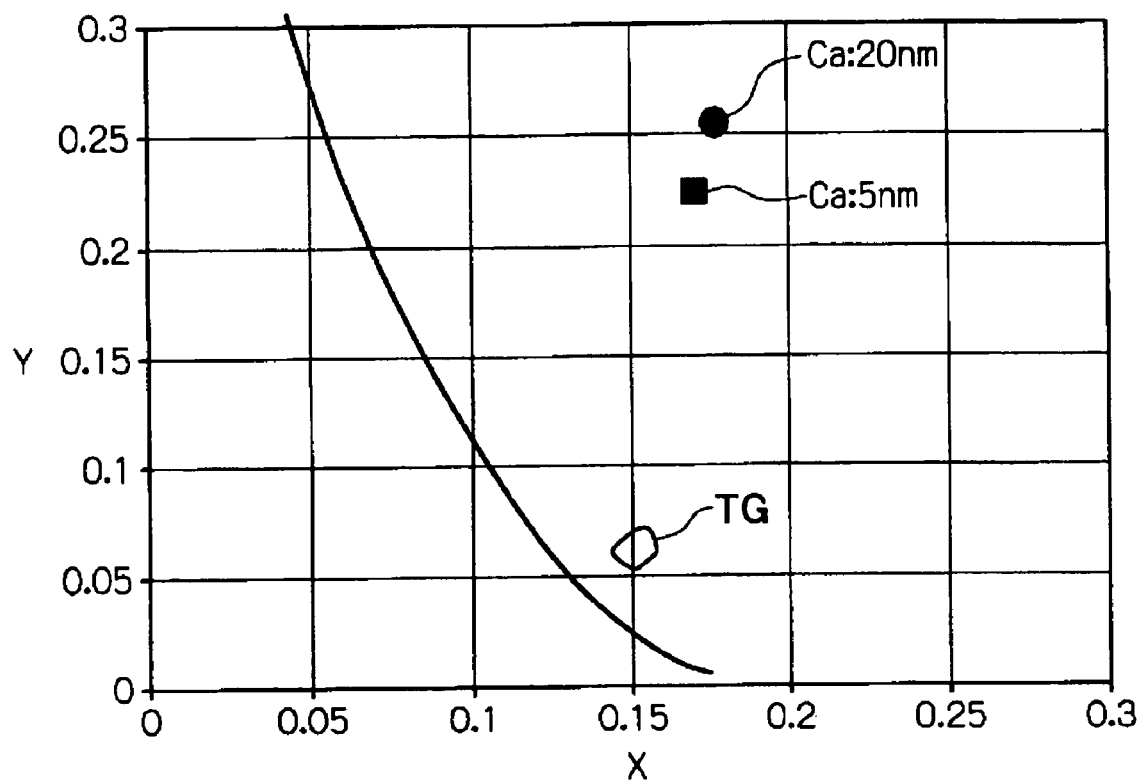
[Fig. 2]
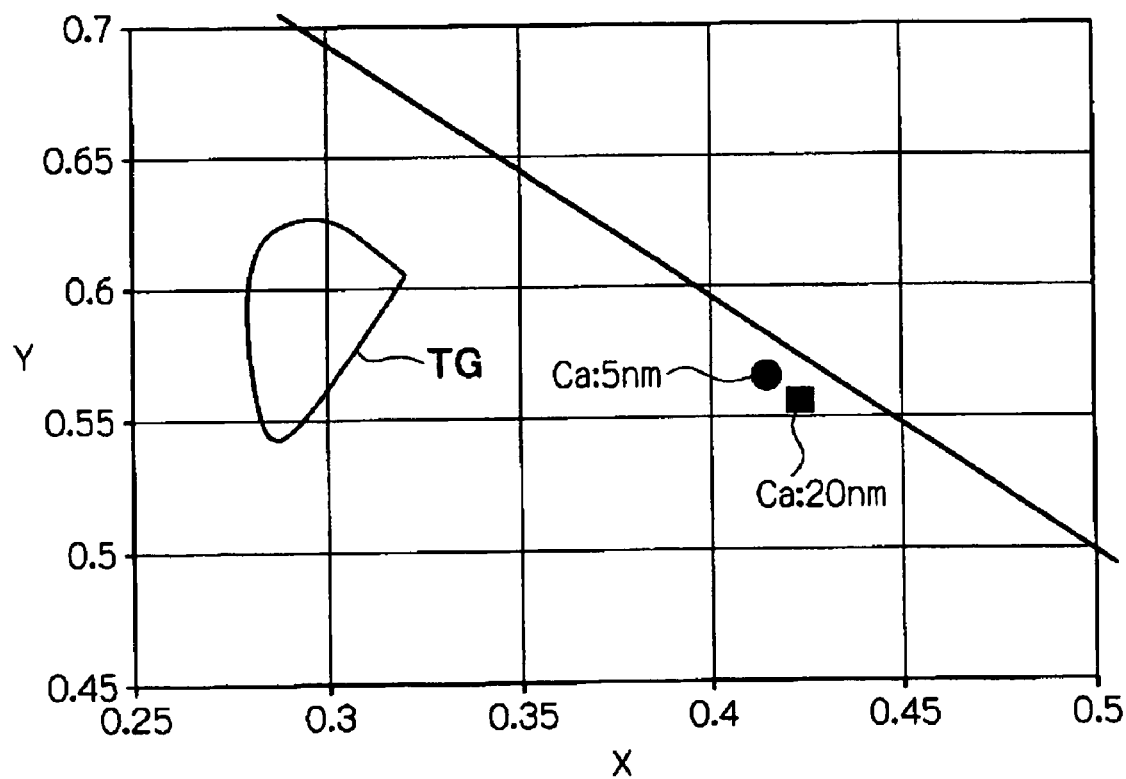
[Fig. 3]

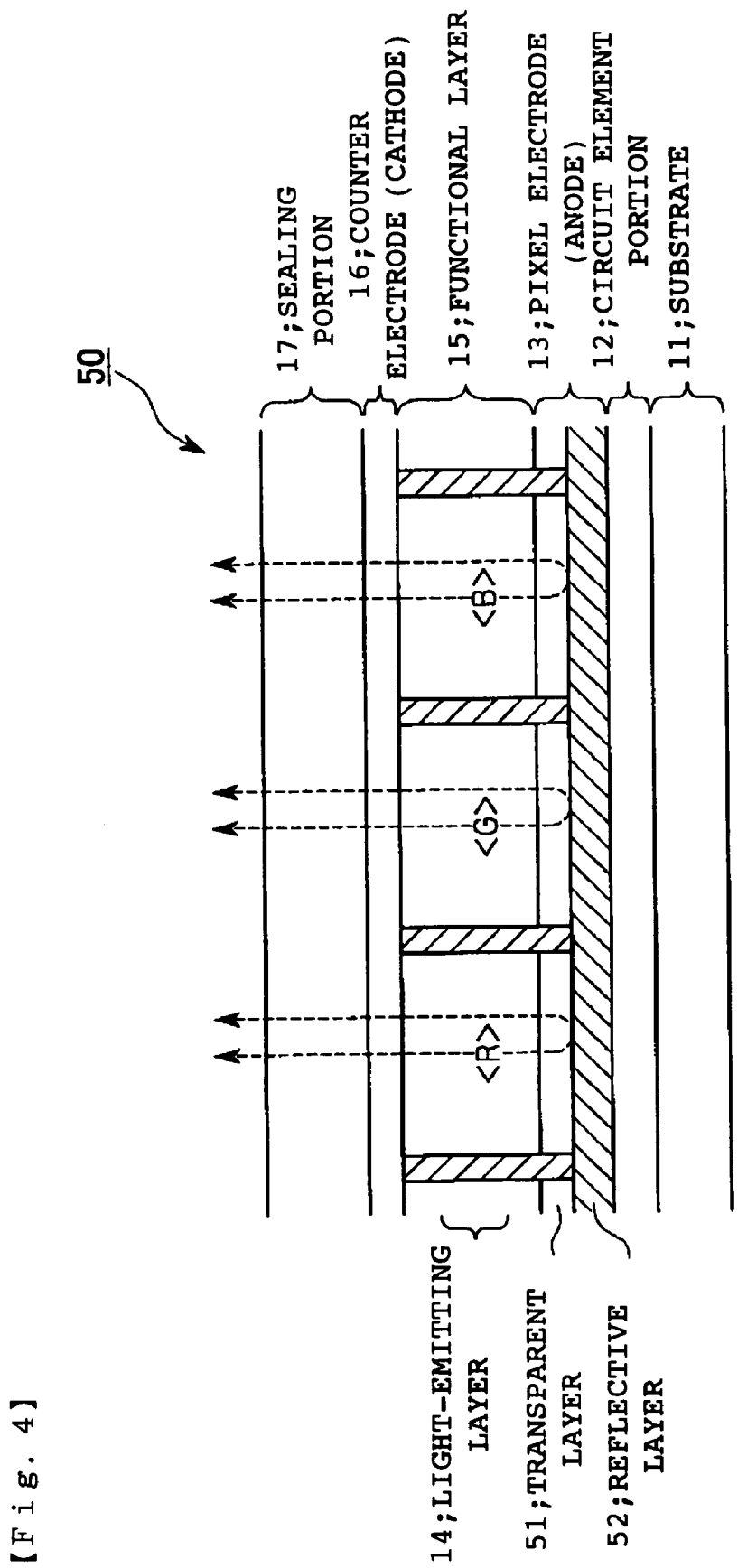
[Fig. 4]

[Fig. 5]
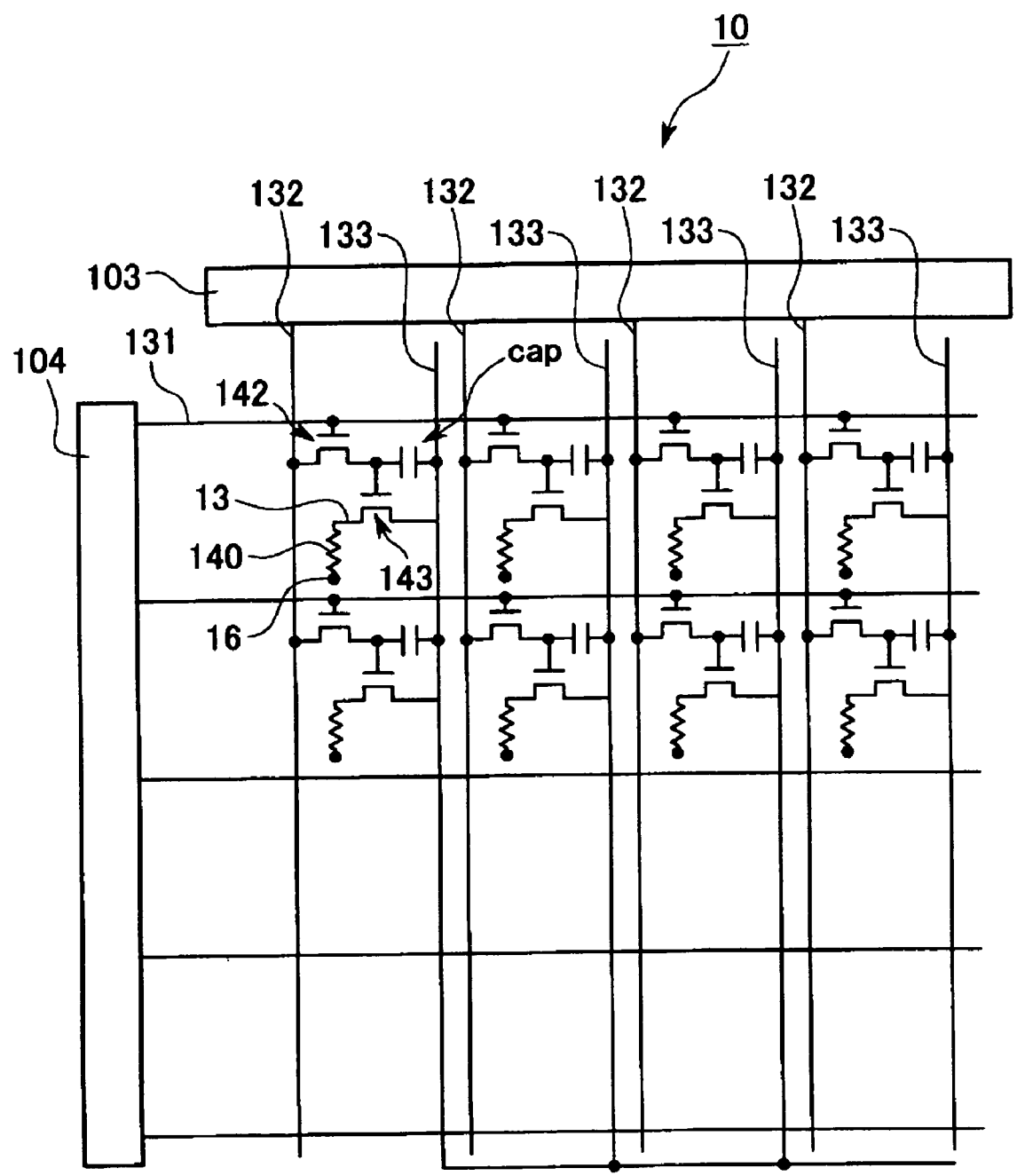

[Fig. 6]
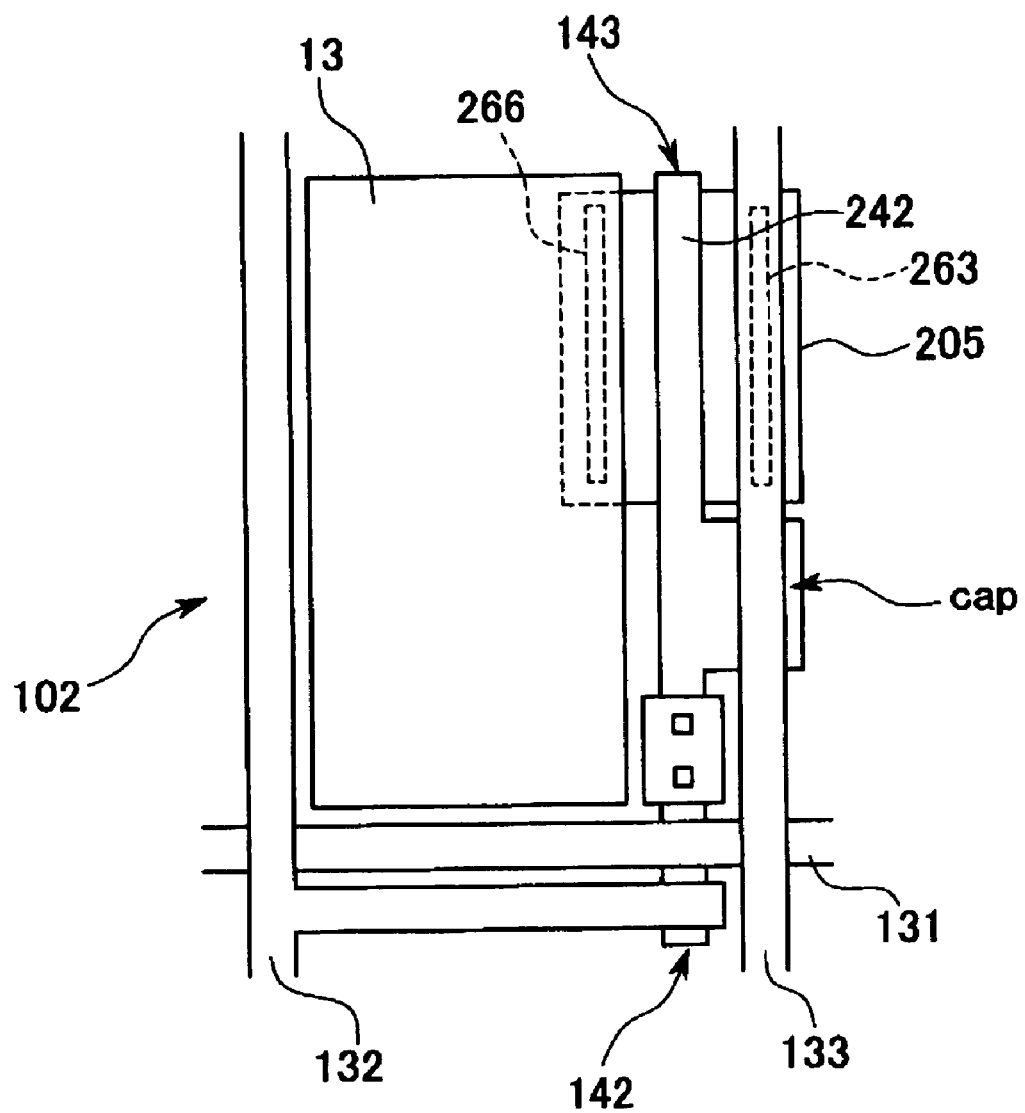

[Fig. 7]
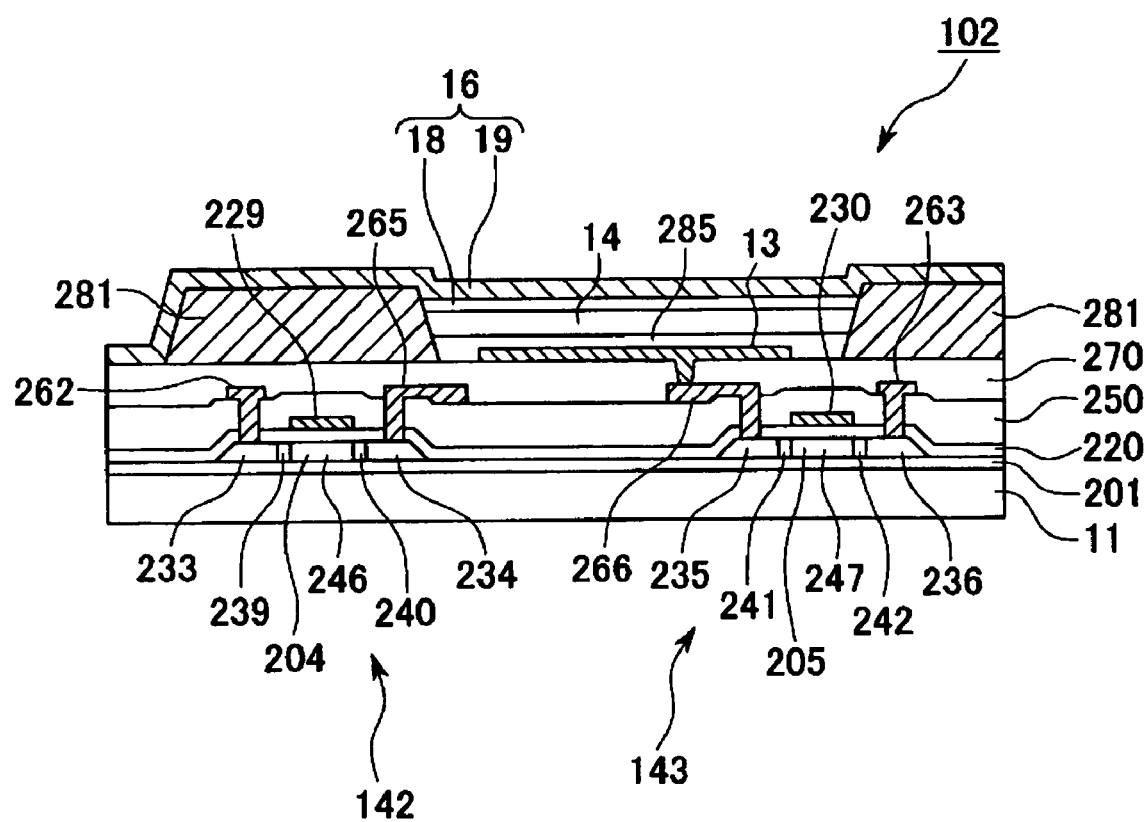

[Fig. 8]
(a)
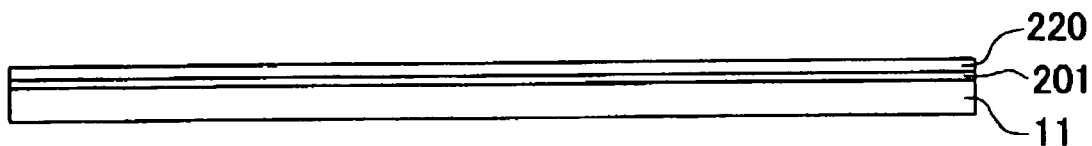
(b)
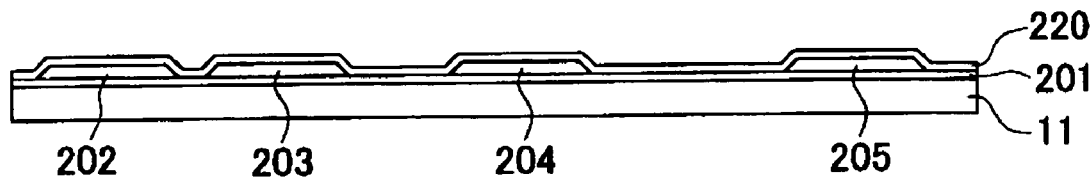
(c)
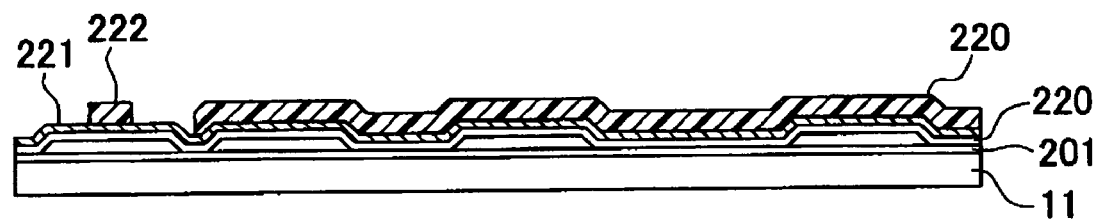
(d)
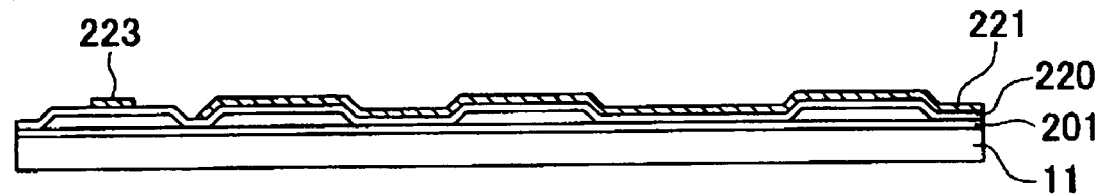
(e)
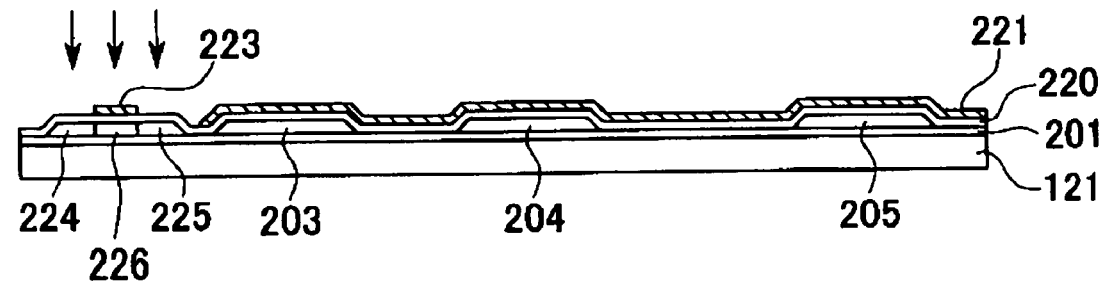

[Fig. 9]
(a)
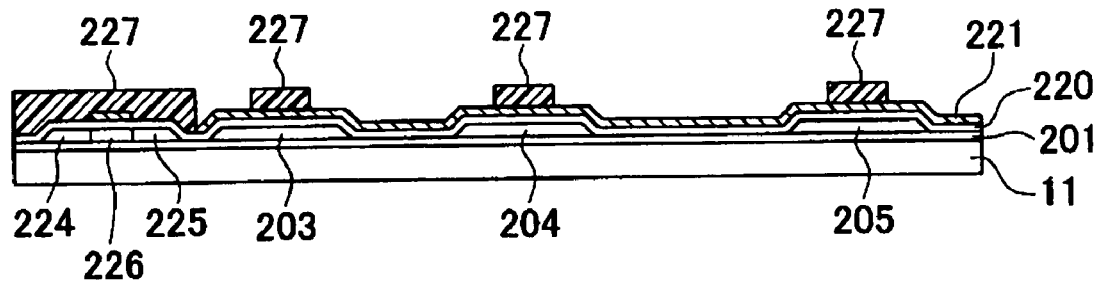
(b)
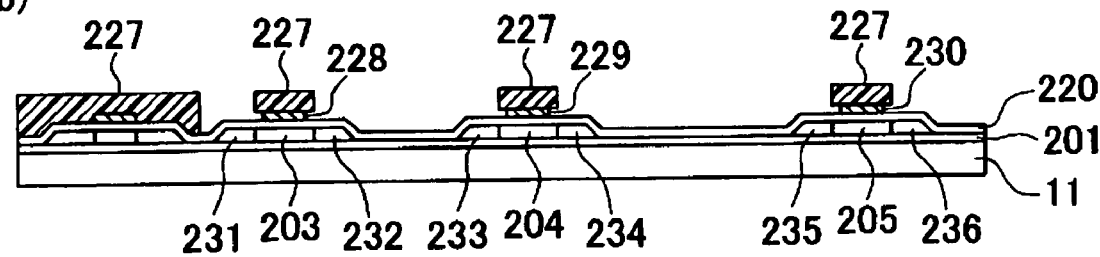
(c)
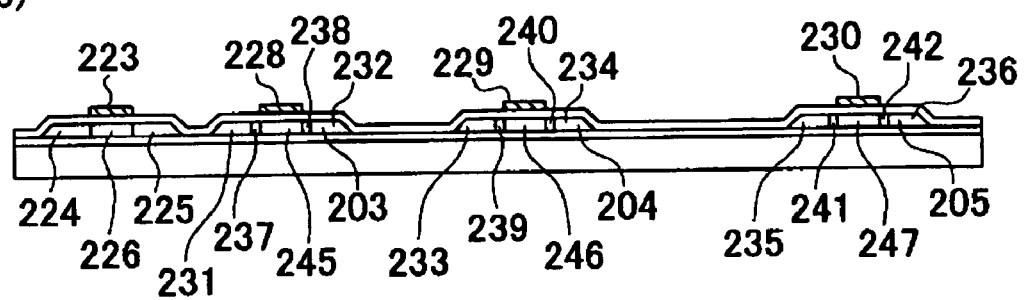
(d)
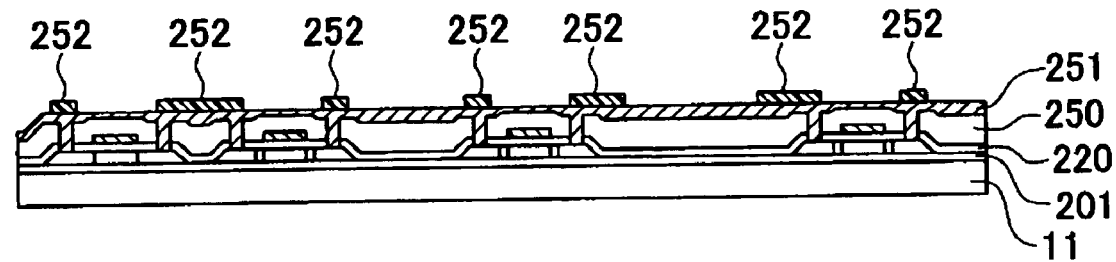
(e)
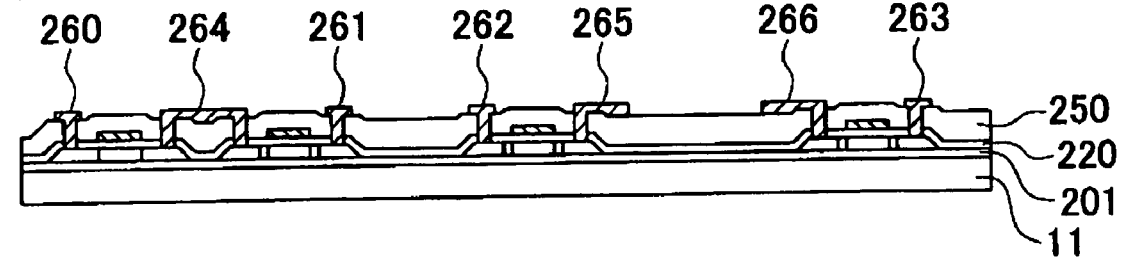

[Fig. 10]
(a)
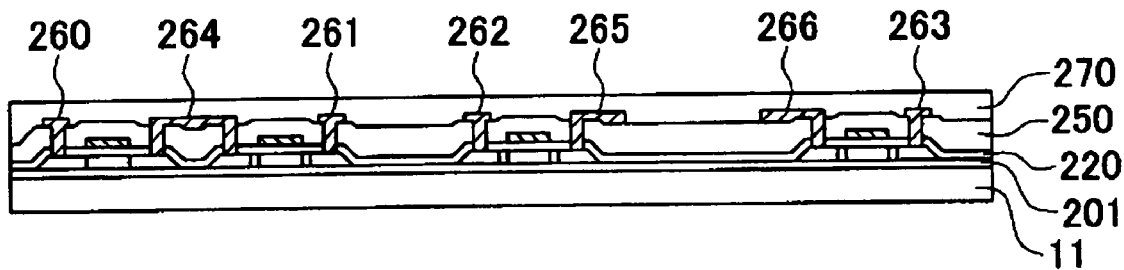
(b)
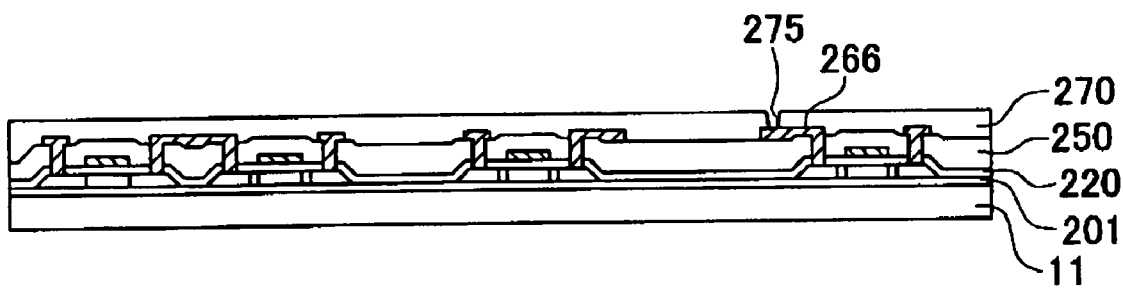
(c)
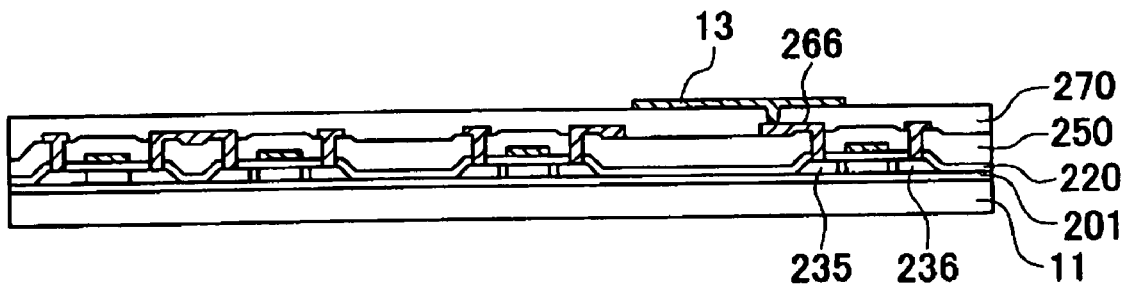

[Fig. 11]
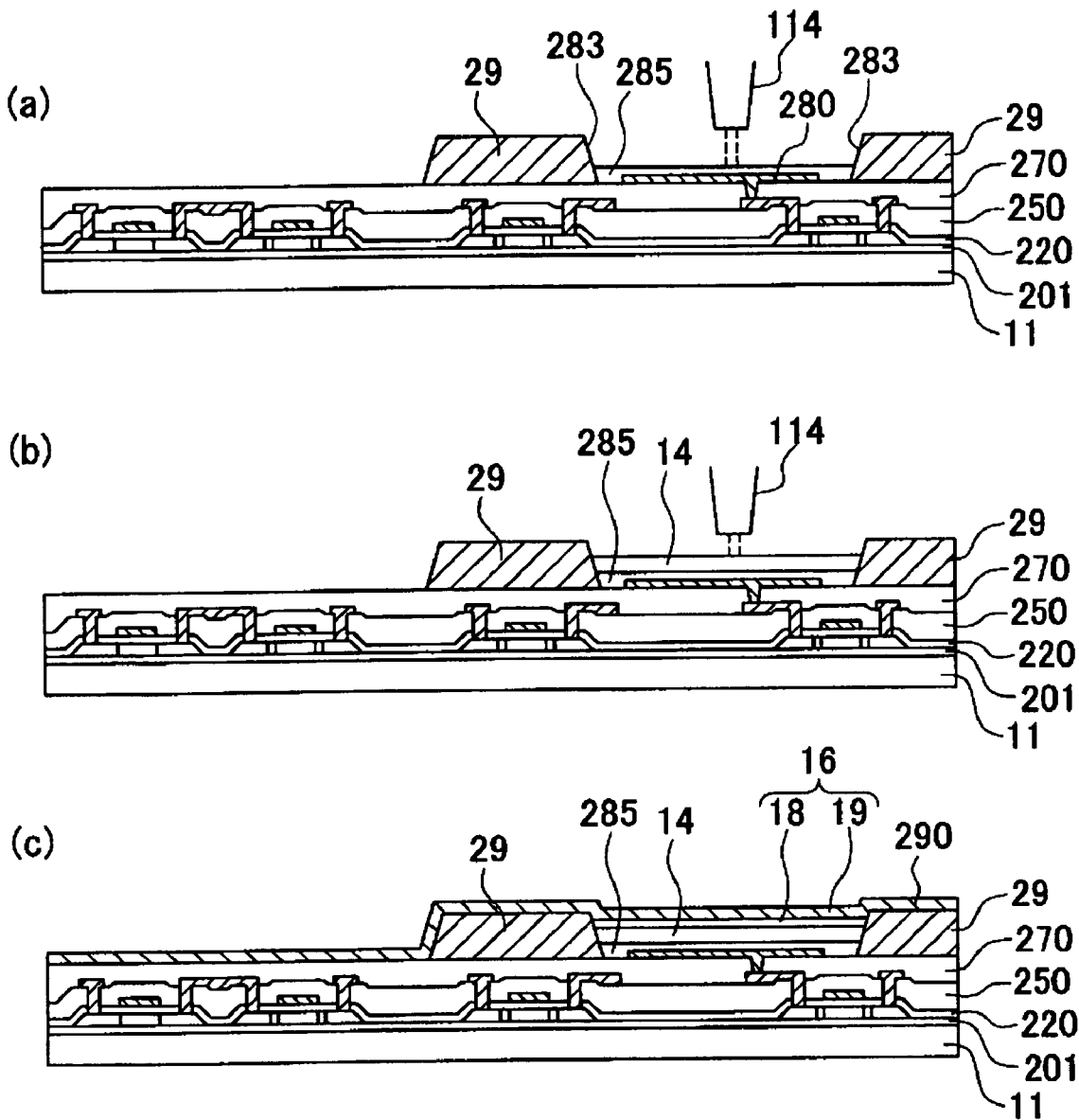

[Fig. 12]
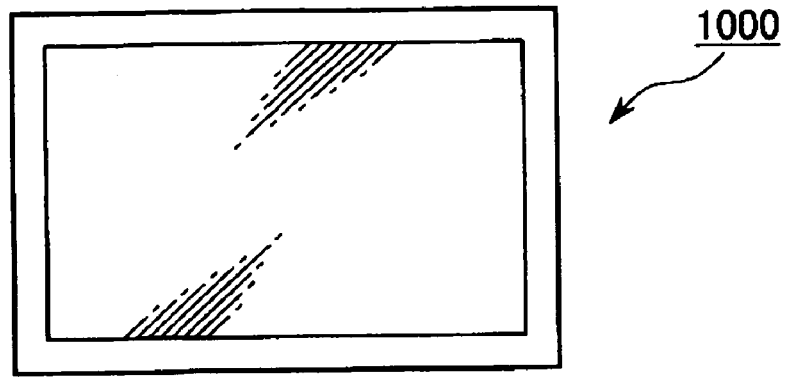
[Fig. 13]
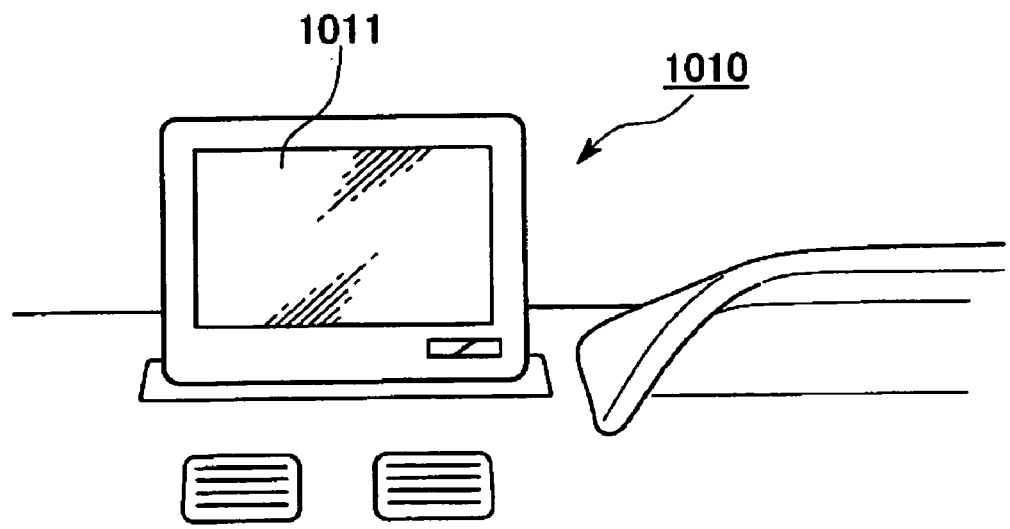
[Fig. 14]
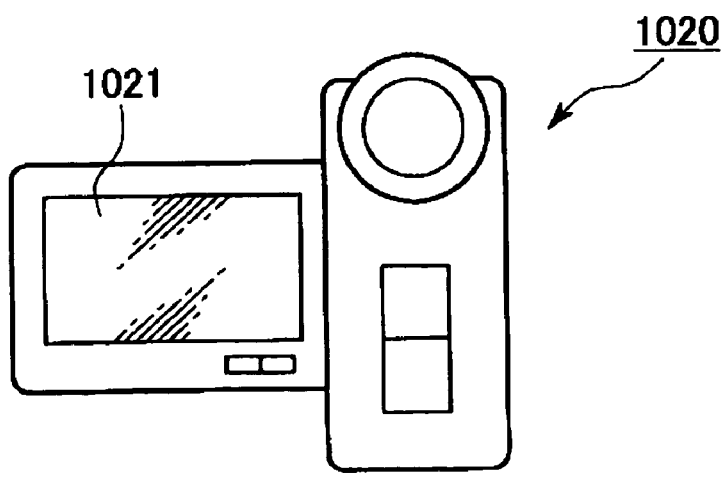

[Fig. 15]
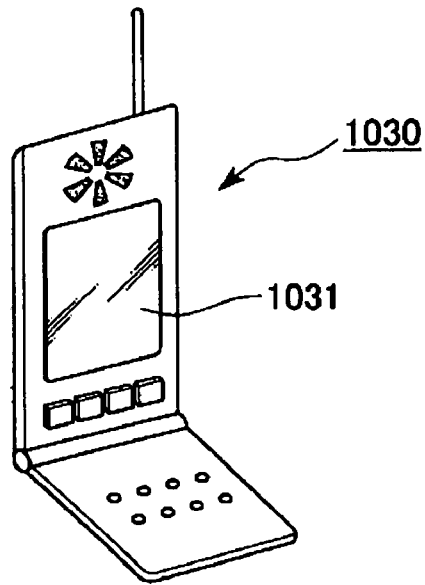
[Fig. 16]
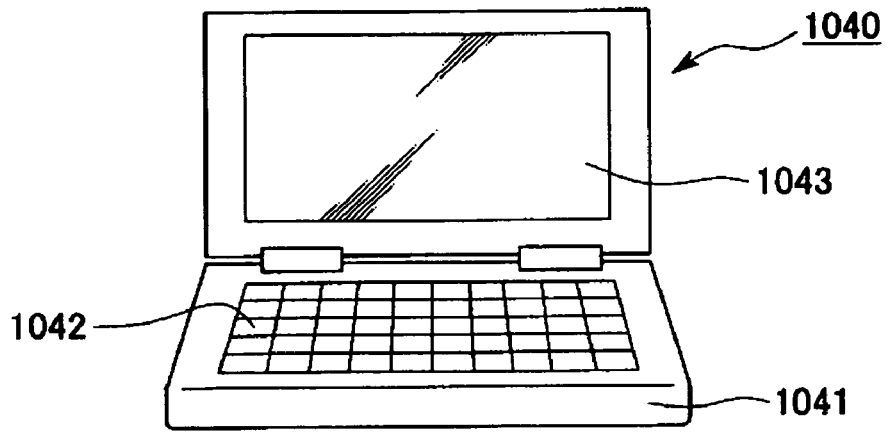
[Fig. 17]
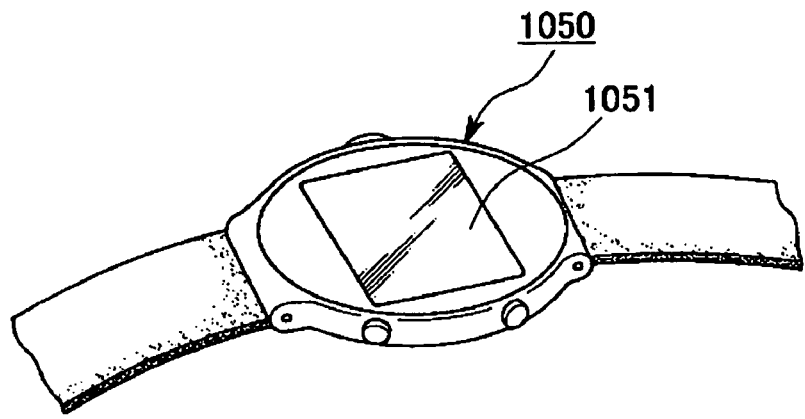

LIGHT-EMITTING DEVICE, METHOD OF MANUFACTURING THE SAME, AND ELECTRONIC APPARATUS

BACKGROUND OF THE INVENTION

1. Field of Invention

The present invention relates to a light-emitting device having light-emitting layers, a method of manufacturing the same, and an electronic apparatus.

2. Description of Related Art

Light-emitting devices having light-emitting layers include, for example, organic electroluminescent (hereinafter "organic EL") display devices having organic EL elements. Generally, in the organic EL elements, organic functional layers having light-emitting layers are disposed between two opposing electrodes.

Organic EL display devices have light-emitting layers to emit light having predetermined chromaticities corresponding to the colors R (red), G (green), and B (blue) for color display. Further, the light-emitting layers corresponding to the colors are disposed in a predetermined array on a substrate.

The chromaticity of the light emitted in the light-emitting layers is obtained, for example, by selecting appropriate materials to form the light-emitting layers. However, in the case that the chromaticity of the extracted light differs from its target value, the chromaticity of the emitted light must be corrected.

SUMMARY OF THE INVENTION

The present invention addresses the above and/or other problems, and provides a light-emitting device and a method of manufacturing the same to enhance or optimize the chromaticity of the light.

The present invention also provides an electronic apparatus in which the display quality is enhanced.

After careful examination, the inventor discovered that after the light emitted in the light-emitting layers is incident on the electrode layers, the light is extracted from the electrode layers, and the chromaticity of the light extracted from the electrode layers is varied depending on the film thicknesses of the electrode layers. Therefore, the inventors have addressed or solved the above by determining the film thicknesses of the electrode layers so that the light extracted from the electrode layers has a predetermined chromaticity value.

In other words, the light-emitting device according to the present invention includes light-emitting layers and electrode layers, and film thicknesses of the electrode layers are set so that light extracted from the light-emitting device out of the light emitted in the light-emitting layers has a predetermined chromaticity value.

According to the light-emitting device, it is possible to enhance or optimize the chromaticity of the light.

In the light-emitting device, it is preferable that the light-emitting layers include three types of light-emitting layers corresponding to the three colors red, green, and blue, and that film thicknesses of the electrode layers are individually set corresponding to the regions on which light from the three types of light-emitting layers is incident.

The film thickness of each electrode layer corresponding to each of the colors red, green, and blue is individually set, so that it is possible to enhance or optimize the chromaticity of the light corresponding to each color.

Further, in the light-emitting device, it is preferable that the electrode layers comprise a plurality of laminated layers and the film thickness of at least one of the plurality of layers is set.

For example, it is preferable that the plurality of layers includes transparent layers to transmit the light from the light-emitting layers and reflective layers to reflect the light, and film thicknesses of the transparent layers are set. In this case, a part of light from the light-emitting layers is transmitted through the transparent layers, reflected on the reflective layers, and again transmitted through the transparent layers, thereby being extracted. Since the light is transmitted through the transparent layers, the chromaticity of the light is corrected, so that it is possible to enhance or optimize the chromaticity of the light.

An electronic apparatus according to the present invention includes the aforementioned light-emitting device.

Since the electronic apparatus comprises the aforementioned light-emitting device, it is possible to enhance or optimize the chromaticity of the light and to obtain good display quality.

A method of manufacturing a light-emitting device according to the present invention includes disposing light-emitting layers above a substrate; disposing electrode layers above the light-emitting layers; and disposing material layers above the electrode layers to cover the light-emitting layers. The film thicknesses of the electrode layers are set so that light extracted through at least the material layers out of light emitted in the light-emitting layers has a predetermined chromaticity value.

A method of manufacturing a light-emitting device according to the present invention includes disposing light-emitting layers above a substrate; and disposing electrode layers above the light-emitting layers. The film thicknesses of the electrode layers are set so that light extracted through at least the substrate out of light emitted in the light-emitting layers has a predetermined chromaticity value.

According to the manufacturing method, it is possible to manufacture a light-emitting device having a good chromaticity of the extracted light.

In the manufacturing method, it is preferable that the light-emitting layers include three types of light-emitting layers corresponding to the three colors red, green, and blue, and film thicknesses of the electrode layers are individually set corresponding to the regions on which light from the three types of light-emitting layers is incident.

The three types of light-emitting layers may be disposed by using a mask vapor deposition method.

The film thickness of each electrode layer corresponding to each of the colors red, green, and blue is individually set, so that it is possible to enhance or optimize the chromaticity of the light corresponding to each color.

BRIEF DESCRIPTION OF THE DRAWINGS

FIG. 1 is a schematic illustrating an organic EL display device according to an exemplary embodiment of a light-emitting device of the present invention;

FIG. 2 a graph illustrating a result of examination of change of chromaticity (blue) in accordance with change of film thickness of a cathode;

FIG. 3 a graph illustrating a result of examination of change of chromaticity (green) in accordance with change of film thickness of a cathode;

FIG. 4 is a schematic illustrating another constructional exemplary embodiment of an organic EL display device to which the light-emitting device of the present invention is adapted;

FIG. 5 is a schematic circuit diagram illustrating an example of the circuit structure of the organic EL display device;

FIG. 6 is a plan view illustrating an example of the plan structure of the pixel portion of the organic EL display device;

FIG. 7 is a schematic illustrating an expanded cross-section structure of the pixel portion (organic EL element);

FIGS. 8(a)–8(e) are schematics illustrating an exemplary embodiment of a process of manufacturing a display device including organic EL elements to which the method of manufacturing an electro-optical device of the present invention is adapted;

FIGS. 9(a)–9(e) are schematics illustrating an exemplary embodiment of a process of manufacturing a display device including organic EL elements to which the method of manufacturing an electro-optical device of the present invention is adapted;

FIGS. 10(a)–10(c) are schematics illustrating an exemplary embodiment of a process of manufacturing a display device including organic EL elements to which the method of manufacturing an electro-optical device of the present invention is adapted;

FIGS. 11(a)–11(c) are schematics illustrating an exemplary embodiment of a process of manufacturing a display device including organic EL elements to which the method of manufacturing an electro-optical device of the present invention is adapted;

FIG. 12 is a schematic illustrating an exemplary embodiment of an electronic apparatus of the present invention;

FIG. 13 is a schematic illustrating another exemplary embodiment of an electronic apparatus of the present invention;

FIG. 14 is a schematic illustrating another exemplary embodiment of an electronic apparatus of the present invention;

FIG. 15 is a schematic illustrating another exemplary embodiment of an electronic apparatus of the present invention;

FIG. 16 is a schematic illustrating another exemplary embodiment of an electronic apparatus of the present invention;

FIG. 17 is a schematic illustrating another exemplary embodiment of an electronic apparatus of the present invention.

DETAILED DESCRIPTION OF PREFERRED EMBODIMENTS

The present invention is described below with reference to the drawings. In the drawings, the scales may be different from the actual scales in order to make the drawings more easily viewable.

FIG. 1 is a schematic illustrating an organic EL display device according to an exemplary embodiment of a light-emitting device of the present invention. In FIG. 1, the organic EL display device 10 is constructed by stacking on a substrate 11 as a base substance, circuit element portions 12, pixel electrodes (anodes) 13, organic functional layers 15 including light-emitting layers 14, counter electrodes (cathodes) 16 and a sealing portion 17 in this order. The organic EL device (organic EL element) is an electro-optical element constructed with the anodes 13, functional layers 15, and cathodes 16.

Further, reference numeral 29 shown in FIG. 1 is referred to for each of the bank layers as partition members disposed on the boundaries of pixels. The bank layers 29 have a function of preventing adjacent materials from being mixed at the time of manufacturing the organic EL elements.

In the organic EL display device, holes injected from the anodes and electrons injected from the cathodes are re-coupled in the light-emitting layers to be in excited states, thereby leading to light emitting (light emitting when the excited states disappear. Further, the emitted light having a predetermined chromaticity is obtained by selecting appropriate materials to form the light-emitting layers. The materials to form the light-emitting layers include, for example, light-emitting materials made of various fluorescent materials or phosphorescent materials such as low-molecule organic light-emitting colorants, polymer fluorescent materials, etc.

Further, specific functional layers, such as hole-injecting layers, hole-transporting layers, and electron-transporting layers, are appropriately formed between the anodes and the light-emitting layers and between the cathodes and the light-emitting layers.

Further, the electrical control to emit light is carried out by circuit element portions, which include active elements, etc.

The organic EL display device 10 shown in FIG. 1 corresponds to color display and includes three types of light-emitting layers 14 to emit the light having chromaticities corresponding to red (R), green (G), and blue (B). In the case of performing the color display in the organic EL display device, the light-emitting layers corresponding to R, G, and B are disposed on the substrate in a predetermined array of a stripe shape, a matrix shape (mosaic shape) or a delta shape, etc. Further, the display device 10 is constructed in a so called back emission type in which the emitted light of the organic EL element is extracted from the substrate 11.

In the back emission type of the organic EL display device 10, the light which is emitted to the substrate 11 out of the light emitted in the light-emitting layers 14 is transmitted through the substrate 11 and extracted in an intact manner. On the other hand, the light which is emitted to the opposite side of the substrate 11 is reflected on the cathodes 16 and then transmitted through the light-emitting layers 14, etc., thereby being extracted from the substrate 11. In other words, the light (the observed light) extracted from the display device 10 includes the light that is directly emitted to the substrate 11 and the light that is reflected on the cathodes 16.

Since the light is extracted from the substrate 11 in the display device 10, the material of the substrate 11 is transparent or semitransparent.

Similarly, the material to form the anode 13 is also transparent, such as ITO, etc.

Further, the cathodes 16 are constructed in a laminated structure having transparent layers 18 to transmit the light from the light-emitting layers 14 and reflective layers 19 to reflect the light. The transparent layers 18 are disposed in the vicinity of the light-emitting layers 14 and the reflective layers 19 are disposed on the outer side of the transparent layers.

The light, which is incident on the cathodes 16 out of the light emitted in the light-emitting layers 14 is transmitted through the transparent layers 18 of the cathodes 16 and then reflected on the reflective layers 19. After that, the reflected light is transmitted through the transparent layers 18 and the light-emitting layers 14 and extracted from the substrate 11.

Further, in the display device 10, the film thicknesses of the cathodes 16 are set so that the chromaticity of the light to be extracted approaches a predetermined target value. More specifically, the film thicknesses of the transparent layers 18 in the cathodes 16 are individually set corresponding to the regions on which the light of the three types of light-emitting layers 14 corresponding to the three colors R, G, and B is incident.

In the target values of the chromaticities, for example, the chromaticities to define the color reproduction range of the CRT (cathode ray tube) are used so that each light corresponding to R, G, and B has color characteristics suitable for full color display.

Further, the method of determining the film thicknesses of the transparent layers is, for example, a method of preparing various types of display devices having different film thicknesses of the transparent layers and then measuring chromaticity of the light, respectively. Next, the relationships between the film thicknesses of the transparent layers and the chromaticity of the light are obtained from the results of the measurements corresponding to R, G, and B, and the film thicknesses of the transparent layers are set on the basis of the relationships so that the chromaticity of the light can be approximated to the predetermined target value.

The original chromaticity of the light from the light-emitting layers 14 is corrected by individually determining the film thicknesses of the transparent layers 18 on which R, G, and B light incident. It is believed that the chromaticity is corrected by the absorption of some of wavelengths of the light which is transmitted through the transparent layers 18 or by interference between the light which is reflected on the surfaces of the transparent layers 18 and the light which is transmitted through the transparent layers 18 and then reflected on the reflective layers 19. By doing so, it is possible to enhance or optimize the chromaticity of the light in the display device 10.

Further, the method of correcting the chromaticity by using the film thicknesses of the transparent layers 18 has an advantage that the deterioration of luminescence of light can be suppressed since any components such as color filters, etc., which cause the luminescence to be deteriorated is not used.

The transparent or semitransparent substrate includes, for example, a glass substrate, a quartz substrate, a resin substrate (a plastic substrate, and a plastic film substrate), etc., and more particularly, an inexpensive soda glass substrate is suitably used. Further, in case of using the soda glass substrate, it is possible to enhance the planarity of the substrate as well as to protect the soda glass, which is vulnerable to acid or alkali, by carrying out a silica coating over the soda glass substrate.

Further, transparent electrode materials such as ITO, IZO, etc., are used as materials to form the anodes.

Further, materials to form the cathodes include, for example, aluminum (Al), magnesium (Mg), gold (Au), silver (Ag), calcium (Ca), ITO, IZO, lithium fluoride (LiF), etc.

The laminated structures having the transparent layers and reflective layers in the cathodes 16 include, for example, Ca/Al (transparent layer/reflective layer; a laminated film of Ca and Al), Mg/Ag, Ca/Ag, Ba/Ag, M/Ag, etc., (wherein M is referred to as at least one of the rare earth elements, and preferably, at least one element of Ce, Yb, Sm, Er, Y, La, Gd (gadolinium), Dy (dysprosium) and Nd (neodymium)).

Further, a film (for example, LiF/Ca/Al), which is made up of LiF, may be disposed on the light-emitting layer sides. Further, in case of cathodes having laminated structures, it is preferable that materials having low work functions are formed in the vicinity of the light-emitting layers. The cathode according to the present invention may include at least transparent layers and reflective layers, but it is not limited to the example. For example, at least one of the transparent layers and reflective layers may be constructed in a laminated structure.

Further, it is preferable that the cathodes are for example, formed by a vapor deposition method, a sputtering method, or a CVD method. In particular, the vapor deposition method is further preferable since it prevents the light-emitting layers from being damaged by heat or reduces such damage.

Further, in order to reduce or prevent the cathodes from oxidizing, protective layers such as $SiO_2$, SiN, etc., may be disposed on the cathodes.

Further, the sealing portion 17 has function of preventing the cathodes 16 or the functional layers 15 from oxidizing by blocking the inflow of water or oxygen. The sealing portion comprises sealing resin, which is applied on the substrate 11, and sealing substrate (sealing can) bonded to the substrate 11. Materials for the sealing resin include, for example, thermosetting resin or ultraviolet-curing resin, and in particular, epoxy resin, which is thermosetting resin, is preferably used. The sealing resin having a shape of ring is applied on the edge of the substrate 11. The sealing resin is applied by, for example, a micro-dispenser. The sealing substrate is made up of glass, metal, etc. The substrate 11 and the sealing substrate are attached to each other through the sealing resin.

FIG. 2 is a graph illustrating a result of an examination of a change of chromaticity of blue (B) in accordance with a change of the film thickness of a cathode in the display device having the aforementioned structure. Further, a blue light-emitting polymer is used for the light-emitting layer, and the laminated structure of (LiF/) Ca/Al is used for the cathode.

In FIG. 2, in case of (LiF: 2 ml/) Ca: 5 nm/Al: 200 nm, the light-emitting chromaticity (x, y)=(0.165, 0.156), while in case of (LiF: 2 nm/) Ca: 20 nm/Al: 200 nm, the light-emitting chromaticity (x, y)=(0.169, 0.167). It is noticed that the chromaticity of the light approaches a target value (TG) by changing the film thickness of the Ca layer, which is a transparent layer of the cathode.

Further, FIG. 3 is a graph illustrating a result of an examination of the change of the chromaticity of green (G) in accordance with change of film thickness of a cathode in the display device having the aforementioned structure. Further, a green light-emitting polymer is used for the light-emitting layer, and the laminated structure of Ca/Al is used for the cathode.

In FIG. 3, in case of Ca: 5 nm/Al: 200 nm, the light-emitting chromaticity (x, y)=(0.41, 0.57), while in case of Ca: 20 nm/Al: 200 nm, the light-emitting chromaticity (x, y)=(0.42, 0.56). It is noticed that the chromaticity of the light approaches a target value (TG) by changing the film thickness of the Ca layer, which is a transparent layer of the cathode.

FIG. 4 illustrates another exemplary embodiment in which the light-emitting device according to the present invention is adapted to an organic EL display device. The display device 50 is a so called "top emission type of display device" in which the light emitted in the light-emitting layers 14 is extracted from the opposite side of the substrate 11 on which the circuit element portions are disposed. Further, in FIG. 4, the components having the function similar to those of the display device 10 shown in FIG. 1 are attached by the similar reference numerals and their descriptions are omitted or simplified.

In the top emission type of the organic EL display device 50, the light, which is emitted to the substrate 11 out of the light emitted in the light-emitting layers 14, is reflected on the anodes 13, and then transmitted through the light-emitting layers 14, thereby being extracted from the opposite side of the substrate 11. On the other hand, the light, which is emitted to the opposite side of the substrate 11, is transmitted through the cathodes 16, etc., in an intact manner, thereby being extracted. In other words, the light extracted from the display device 50 includes the light, which is reflected on the anodes 13, and the light, which is emitted to the opposite side of the substrate 11.

In the display device 50, since the light is extracted from the opposite side of the substrate 11 in the display device 10, the material of the substrate 11 may be transparent or opaque. The opaque substrate includes, for example, thermosetting resin and thermoplastic resin as well as ceramics, such as alumina and sheets of metal, such as stainless that are subject to an insulation process, such as surface oxidation process.

The material to form the anode is transparent, such as indium tin oxide (ITO).

Further, the anodes 13 are constructed in a laminated structure having transparent layers 51 to transmit the light from the light-emitting layers 14 and reflective layers 52 to reflect the light. The transparent layers 51 are disposed in the vicinity of the light-emitting layers 14 and the reflective layers 52 are disposed at the outer side of the transparent layers.

Further, the material to form the cathode 16 is transparent.

The light, which is incident on the anodes 13 out of the light emitted in the light-emitting layers 14, is transmitted through the transparent layers 51 of the anodes 13 and then reflected on the reflective layers 52. After that, the reflected light is transmitted through the transparent layers 51 and the light-emitting layers 14 and extracted from the substrate 11.

In the display device 50, different from the display device 10 shown as FIG. 1, the film thicknesses of the anodes 13 are set so that the chromaticity of the light to be extracted approaches a predetermined target value. More specifically, the film thicknesses of the transparent layers 51 in the anodes 13 are individually set corresponding to the regions on which the light of three types of light-emitting layers 14 corresponding to the three colors R, G, and B is incident.

The original chromaticity of the light from the light-emitting layers 14 is corrected by individually determining the film thicknesses of the transparent layers 51 on which the light of R, G, and B colors is incident. By doing so, it is possible to enhance or optimize the chromaticity of the light in the display device 50.

In case of the top emission type, since the light is extracted from the opposite side of the substrate, it is possible to increase opening ratios of pixels.

Further, the chromaticity of the light emitted in the light-emitting layers can be corrected by changing the film thicknesses of the light-emitting layers 14. For this reason, the film thicknesses of the light-emitting layers and the film thicknesses of the electrodes (cathodes and anodes) on which the light of the light-emitting layers is incident may be set in combination with each other so that the chromaticity of the light approaches a target value more and more.

The display device 10 shown in FIG. 1 is further described below in detail.

FIG. 5 illustrates an example of a circuit structure of the display device 10, and FIG. 6 illustrates an example of a plane structure of a pixel portion in the display device 10.

In the display device 10, as shown in FIG. 5, a plurality of scanning lines 131, a plurality of signal lines 132 which extend in a direction to intersect the scanning lines 131, and a plurality of common feeding lines 133 which extend in parallel with the signal lines 132 are wired respectively on the substrate which is a base substance. A pixel (pixel region element) 102 is provided at each of the intersections of the scanning lines 131 and signal lines 132.

A data driving circuit 103 including, for example, shift registers, level shifters, video lines and analog switches is provided for the signal lines 132. On the other hand, a scanning driving circuit 104 comprising shift registers and level shifters is provided for the scanning lines 131. Further, each of the pixel regions 102 includes a first thin film transistor 142 the gate electrode of which is supplied with the scanning signal through the scanning line 131, a storage capacitor cap which stores an image signal supplied from the signal lines 132 through the first thin film transistor 142, a second thin film transistor 143 the gate electrode of which is supplied with the image signal stored in the storage capacitor cap, an pixel electrode (anode) 13 into which a driving current flows from the common feeding lines 133 when the pixel electrode is electrically connected to the common feeding lines 133 through the second thin film transistor 143, and a light-emitting portion (light-emitting layer) 140 which is interposed between the pixel electrode 13 and the counter electrode (anode) 16.

Further, as shown in FIG. 6, the plane structure of each pixel 102 has a planar shape of a rectangular type in which four sides of the pixel electrode 13 are surrounded by the signal line 132, the common feeding line 133, the scanning line 131, and the scanning line for the other pixel electrode (not shown). The planar shape of the pixel region 102 may be any shape of including, for example, a circle, an ellipse, etc., in addition to the rectangular shape as shown.

In accordance with this construction, when the first thin film transistor 142 is turned ON by driving the scanning line 131, the potential of the signal line 132 at that time is stored in the storage capacitor cap, and the conduction state of the second thin film transistor 143 is set on the basis of the state of the storage capacitor cap. Further, a current flows from the common feeding line 133 through a channel of the second thin film transistor 143 to the pixel electrode 13, and a current flows through the light-emitting portion 140 to the counter electrode 16. As a result, the light-emitting portion 140 emits light in accordance with quantity of the current flowing into the light-emitting portion.

FIG. 7 illustrates an expanded cross-section structure of a pixel portion 102 (organic EL element).

In FIG. 7, the organic EL element comprises a substrate, an anode 13 (pixel electrode) which is made up of a transparent electrode material, a hole-injecting layer (hole-transporting layer) 285 to inject or transport holes, a light-emitting layer 14 (organic EL layer) including the organic EL material which is any one of electro-optical materials, a cathode 16 (counter electrode) which is disposed on the upper surface of the light-emitting layer 14, and thin film transistors 142, 143, which are formed on the substrate 11 as a conduction controlling portion to control whether to write the data signal in the anode 13. Further, the electron-transporting layer may be disposed between the light-emitting layers 14 and the cathode 16.

In the present exemplary embodiment, both of the thin film transistors 142, 143 are constructed with N channel type. Further, the thin film transistors 142, 143 are not limited to the case that both of them are an N channel type of TFT. Both or any one of them may be a P channel type of a thin film transistor.

The thin film transistors 142, 143 include semiconductor films 204, 205 which are disposed on the substrate 11 through a base protective film 201 which has, for example, SiO2 as main material, are made up of silicon, etc., and are formed on the upper layer of the base protective film 201; a gate-insulating film 220 which is disposed on the upper layer of the base protective film 201 to cover the semiconductor films 204, 205; gate electrodes 229, 230 which are disposed on some portions opposite to the semiconductor films 204, 205 out of upper surface of the gate-insulating film 220; a first interlayer-insulating film 250 which is disposed on the upper layer of the gate-insulating film 220 to cover the gate electrodes 229, 230; source electrodes 262, 263 which are connected to the semiconductor films 204, 205 through contact holes which open over the gate-insulating film 220 and the first interlayer-insulating film 250; drain electrodes 265, 266 which are interposed between the gate electrodes 229, 230 at the positions opposite to the source electrodes 262, 263 and connected to the semiconductor films 204, 205 through contact holes which open over the gate-insulating film 220 and the first interlayer-insulating film 250; and a second interlayer-insulating film 270 which is disposed on the upper layer of the first interlayer-insulating film 250 to cover the source electrodes 262, 263 and the drain electrodes 265, 266.

Further, a pixel electrode (anode) 13 is disposed on the upper surface of the second interlayer-insulating film 270, and the pixel electrode 13 and the drain electrode 266 are connected to each other through contact holes which are provided through the second interlayer-insulating film 270. Further, a third insulating layer (bank layer) 281 made up of synthetic resin is disposed between the cathode 16 and some portions of surface of the second interlayer-insulating film 270 where the organic EL elements are not provided.

Further, although the bank layer 281 has a taper structure where the length of the upper side is less than that of the lower side in FIG. 7, the bank layer may have a structure where the length of the upper side is equal to or greater than that of the lower side.

Further, when the material of the first interlayer-insulating film 250 is different from the material of the second interlayer-insulating film 270, it is preferable that as shown in the drawing, contact holes which are disposed through the first interlayer-insulating film 250 and contact holes 275 which are disposed through the second interlayer-insulating film 270 are not overlapped.

Further, channel regions 246, 247 are the regions within the semiconductor films 204, 205 which overlap the gate electrodes 229, 230, which sandwich the gate-insulating film 220 between them. Further, source regions 233, 236 are disposed at the source sides of the channel regions 246, 247 within the semiconductor films 204, 205, while the drain regions 234, 235 are disposed at drain sides of the channel regions 246, 247. The source regions 233, 236 are connected to the source electrodes 262, 263 through contact holes which open over the gate-insulating film 220 and the first interlayer-insulating film 250. On the other hand, drain regions 234, 235 are connected to the drain electrodes 265, 266 which are formed of the same layer as the source electrodes 262, 263 through contact holes which open over gate-insulating film 220 and the first interlayer-insulating film 250. The pixel electrode 13 is electrically connected to the drain region 235 of the semiconductor film 205 through the drain electrode 266.

An exemplary embodiment where the method of manufacturing the light-emitting device according to the present invention is adapted to a process of manufacturing the aforementioned organic EL display device is described below with reference to FIGS. 8(a) to 11(c). In the present exemplary embodiment, the process of manufacturing organic EL elements including the aforementioned thin film transistors 142, 143 as well as process of manufacturing thin film transistors for N type and P type driving circuits will be described together.

First, as shown in FIG. 8(a), the base protective film 201 is formed on the substrate 11. The base protective film 201 is made up of silicon oxide film having thickness of about 200 to 500 nm by a plasma CVD method in which TEOS (tetraethoxysilane) or oxygen gas is used as a source, as necessary.

Further, silicon nitride film or silicon oxide nitride film besides the silicon oxide film may be used for the base protective film. By providing these insulating films, it is possible to enhance the heat radiating property.

Next, the temperature of the substrate 11 is set to about 350° C. and a semiconductor film 200 is formed on the surface of the base protective film. The semiconductor film is made up of an amorphous silicon film having thickness of about 30 to 70 nm by an ICVD method or the plasma CVD method. The semiconductor film 200 is not limited to the amorphous silicon film, but it may be a semiconductor film comprising an amorphous structure of a micro crystal semiconductor film, etc. Further, it may be a compound semiconductor film including an amorphous structure of an amorphous silicon germanium film, etc.

Subsequently, the semiconductor film 200 is crystallized into a poly silicon film by a crystallization process, such as laser annealing method or a rapid heating method (a lamp annealing method or a thermal annealing method) over the semiconductor film 200. In the laser annealing method, for example, an excimer laser the line beam of which has longitudinal length of 400 mm is used and the power strength is, for example, 200 mJ/cm2. Further, the second or third harmonics of a YAG laser may be used. It is preferable that the line beam is scanned so that some portion of line beam corresponding to 90% of peak value of the laser strength in the transverse direction is superposed on each region.

Next, as shown in FIG. 8(b), by use of patterning process using a photolithography, etc., unnecessary portions are removed from the semiconductor film (poly silicon film) 200 and semiconductor films 202, 203 204, 205 having island shapes are formed corresponding to thin film transistor formation regions.

Subsequently, a gate-insulating film 220 which is made up of silicon oxide film or nitride film (silicon oxide nitride film, etc.) having thickness of about 60 to 150 nm is formed to cover the semiconductor film 200 by a plasma CVD method using TEOS or oxygen gas as a source. The gate-insulating film 220 may be a single-layered or laminated structure. Further, it is not limited to the plasma CVD method, and other methods, such as thermal oxidation method, may be used. Further, in the case that the gate-insulating film 220 is formed by using thermal oxidation method, the semiconductor films 200 are also crystallized, so that these semiconductor films may be become poly silicon films.

Next, as shown in FIG. 8(c), the gate electrode formation conductive film 221 which includes a doped silicon, a silicide film, or metals, such as aluminum, tantalum, molybdenum, titanium, tungsten, etc., is formed on the entire surface of the gate-insulating film 220. The thickness of the conductive film 221 is, for example, about 200 nm.

Subsequently, the patterning mask 222 is formed on the surface of the gate electrode formation conductive film 221 and under this state, the patterning process is performed, thereby forming the gate electrode 223 at the side where P type driving circuit transistor is formed, as shown in FIG. 8(d). At that time, since the gate electrode formation conductive film 221 is covered with the patterning mask 222 at the sides of the N type pixel electrode transistor and the N type driving circuit transistor, the gate electrode formation conductive film 221 is not patterned. Further, the gate electrode may be formed in a single conductive film or laminated structure.

Next, as shown in FIG. 8(e), P type of impurity element (boron in the present exemplary embodiment) is ion-injected by using a mask including the gate electrode 223 of the P type driving circuit transistor and the gate electrode formation conductive film 221 which remains on the regions where the N type pixel electrode transistor and N type driving circuit transistor are to be formed. The quantity of the dose is, for example, about 1×1015 cm−2. As a result, highly doped source and drain regions 224, 225 the impurity concentration of which is, for example, 1×1020 cm−3 are formed over the gate electrode 223 in a self-aligned manner. Here, the region which is covered with the gate electrode 223 becomes the channel region 226 since the impurity is not introduced to the region.

Next, as shown in FIG. 9(a), a patterning mask 227 including a resist mask, etc., is formed to cover the entire side of P type driving circuit transistor and the gate electrode formation regions of the N type pixel electrode TFT 10 and the N type driving circuit transistor sides.

Next, as shown in FIG. 9(b), the gate electrode formation conductive film 221 is patterned by using patterning mask 227, and the gate electrodes 228, 229, 230 of the N type pixel electrode transistor and N type driving circuit transistor are formed.

Subsequently, an N type impurity element (phosphorus in the present exemplary embodiment) is ion-injected while the patterning mask 227 remains. The quantity of the dose is, for example, 1×1015 cm−2. As a result, the impurity is introduced in a self-aligned manner over the patterning mask 227, thereby forming a highly doped source and drain regions 231, 232, 233, 234, 235, 236 within the semiconductor films 203, 204, 205. Here, the regions to which high concentration of phosphorus is not introduced within the semiconductor films 203, 204, 205 are wider than the regions, which are covered with gate electrodes 228, 229, 230. In other words, the regions (lightly doped source and drain regions, described below) to which a high concentration of phosphorus is not introduced is formed between the highly doped source and drain regions 231, 232, 233, 234, 235, 236 at both sides of the regions opposite to the gate electrode 228, 229, 230 within the semiconductor films 203, 204, 205.

Next, the patterning mask 227 is removed, and under the state, N type impurity element (phosphorus in the present embodiment) is ion-injected. The quantity of the dose is, for example, 1×1013 cm−2. As a result, a low concentration of impurity is introduced in a self-aligned manner over the gate electrodes 228, 229, 230 within the semiconductor films 203, 204, 205, thereby forming lightly doped source and drain regions 237, 238, 239, 240, 241, 242 as shown in FIG. 9(c). Further, the regions, which are superposed with the gate electrodes 228, 229, 230, become the channel region 245, 246, 247 since impurity is not introduced to the regions.

Next, as shown in FIG. 9(d), the first interlayer-insulating film 250 is formed on the surfaces of the gate electrodes 228, 229, 230 and patterned by a photolithography method, etc., thereby forming contact holes at the predetermined source electrode and drain electrode positions. The first interlayer-insulating film 250 may be an insulating film comprising silicon, for example, silicon oxide nitride film or silicon oxide film. Further, the first interlayer-insulating film may be a single layer or laminated layer film. Further, heat treatment is carried out under the hydrogen ambient, thereby hydrogen-terminating (hydrogenating) the unpaired bonds of the semiconductor films. Further, the hydrogenation may be performed by using the hydrogen which is excited by plasma.

Subsequently, a conductive film 251 which becomes a source electrode or a drain electrode is formed by metal films, such as an aluminum film, chromium film, or tantalum film, etc., from the upper side. The thickness of the conductive film 251 is, for example, about 200 nm to 300 nm. The conductive film may be a single layer film or a laminated layer film.

Subsequently, while a patterning mask 252 is formed at the source electrode and drain electrode positions, as shown in FIG. 9(e), at the same time the source electrodes 260, 261, 262, 263, and the drain electrodes 264, 265, 266 are formed by carrying out patterning.

Next, as shown in FIG. 10(a), the second interlayer-insulating film 270 made up of silicon nitride, etc., is formed. The thickness of the second interlayer-insulating film 270 is, for example, about 1 to 2 μm. A material through which light can be transmitted, such as silicon oxide film, organic resin, silica aero-gel, etc., is used for the material to form the second interlayer-insulating film 270. Acryl, polyimide, polyamide, BCB (benzocyclobutene), etc., may be used for the organic resin.

Next, as shown in FIG. 10(b), the second interlayer-insulating film 270 is removed by etching, thereby forming a contact hole 275 which approaches the drain electrode 266.

Next, as shown in FIG. 10(c), a film made up of, for example, ITO or SnO2 which is formed by fluorine-doping, or a transparent electrode material, such as ZnO, polyaniline, etc., is formed to be buried in the contact hole 275, so that the pixel electrode 13 is formed to electrically connect to the source and drain regions 235, 236. Further, the pixel electrode 13 becomes the anode of the EL element.

As shown in FIG. 11(a), the third insulating layers (bank layers) 29 are formed to sandwich the pixel electrode 13 between them. In particular, an insulating layer is formed by applying the resists, such as acryl resin, polyimide resin, etc., that is dissolved by a solvent by spin coat or deep coat, etc., and at the same time the insulating layer is etched by the photolithography technique. A synthetic resin, such as acryl resin, polyimide resin, etc., is used for the third insulating layer 29. Further, the bank layers including wires such as signal lines, common feeding lines, scanning lines, etc., may be formed.

Subsequently, the hole-injecting layer 285 is formed to cover the pixel electrode 13.

In the present exemplary embodiment, the hole-injecting layer 285 is formed by using liquid droplet-ejecting device to eject the formation materials as liquid droplets. In other words, the material to form the hole-injecting layer 285 is ejected from nozzles 114 toward the substrate 11. The hole-injecting layer 285 is formed on the substrate 11 by disposing a predetermined quantity of the material on the substrate 11.

Further, in the case that the materials are in a liquid state on the substrate 11, the materials have a tendency to extend in a horizontal direction due to fluidity of the materials, but the partition wall of the third insulating layers (bank layers) prevent the materials from extending. Further, in the case that there is no problem due to the fluidity of the materials by the process condition or the material characteristic, the third insulating layer may has lower height or no partition wall. Further, after the materials are ejected from the nozzle 114 on the substrate 11, if necessary, the substrate 11 may be treated by heating, light illumination, etc., thereby solidifying or curing the materials.

It is preferable that the material to form hole-injecting layer includes, for example, PEDT/PSS which is a compound of polyethylene dioxythiophene and polystylene sulfonic acid. A compound of polyaniline and polystyrene sulfonic acid or copper phthalocyanine (CuPc) may alternatively be used. Further, in the case that both the hole-injecting layer and the hole-transporting layer are formed in low-molecule organic EL elements, it is preferable that, for example, the hole-injecting layer is formed at the pixel electrode side before forming the hole-transporting layer, and then the hole-transporting layer is formed thereon. In this manner, by forming the hole-injecting layer and the hole-transporting layer together, it is possible to control the rising of the driving voltage and also to lengthen the driving life time (half-life period).

Next, as shown in FIG. 11(*b*), the light-emitting layer 14 is formed on the hole-injecting layer 285.

In the present exemplary embodiment, the light-emitting layer 14 is formed by using the aforementioned liquid droplet-ejecting device similarly to the aforementioned hole-injecting layer. In other words, the materials to form the light-emitting layer 14 is ejected as liquid droplets from the nozzle 114 to the substrate 11.

Polymer fluorescent substances may be used as materials to form the light-emitting layer 14. Although a polymer having a light-emitting radical at its side chain can be used, it is preferable that a polymer having a conjugated system structure at the principal chain, particularly, poly fluorene, poly-p-phenylene vinylene, polythiophene, polyarylene vinylene, and their derivatives is used. Among them, polyarylene vinylene, and its derivative are preferable. The polyarylene vinylene, and its derivative are a polymer including the repeat unit represented by the following chemical formula (1) at 50 mol % or more of total repeat units. It is preferable that the repeat unit represented by the following chemical formula (1) is 70 mol % or more of total repeat units besides the structure of the repeat unit according to the structure of the repeat unit.

—Ar—CR=CR'—  (1)

Here, Ar is a heterocyclic compound radical or an arylene radical comprising 4 or more to 20 or less carbon atoms which are involved in conjugated bonds, and R and R' independently represent radicals selected among a group including an alkyl radical having hydrogen and carbon number of 1 to 20, an aryl radical having carbon number of 6 to 20, a heterocyclic compound radical having carbon number of 4 to 20, and a cyano radical.

The polymer fluorescent substances may include an aromatic compound radical or its derivatives, a heterocyclic compound radical or its derivatives and a radical which are obtained by combining the aforementioned radicals, as repeat units besides the repeat unit represented by chemical formula (1). Further, the repeat unit represented by the chemical formula (1) or the other repeat units may be connected with non-conjugated units having ether radicals, ester radicals, an amide radicals, and imide radicals, and these non-conjugated portions may be contained in the repeat unit.

In the polymer fluorescent substances, Ar of chemical formula (1) is a heterocyclic compound radicals or an arylene radicals comprising 4 or more to 20 or less carbon atoms which are involved in conjugated bonds, and for example, an aromatic compound radical represented by chemical formula (2), described later, or its derivatives, a heterocyclic compound radical or its derivatives, and a radical which are obtained by combining the aforementioned radicals. Further, low-molecule fluorescent substances may be used for the low-molecule organic EL elements. The low-molecule fluorescent substances include, for example, naphthalene derivatives, anthracene derivatives, perylene derivatives, colorant base such as polymethine system, quisatene system, coumarine system, cyanine system, etc., metal complex of 8-hydro-quinoline and its derivatives, aromatic amine, tetraphenyl cyclo pentadiene derivatives, or related art or known substances disclosed in Japanese Unexamined Patent Application Publication No. 57-51781 and 59-194393.

The materials to form electron-transporting layers are not particularly limited, and for example, include metal complex of oxadiazole derivatives, anthraquinodimethan and its derivatives, benzoquinone and its derivatives, naphthoquinone and its derivatives, anthraquinone and its derivatives, tetra cyano anthraquinodimethan and its derivatives, fluorenone derivatives, diphenyldicyano ethylene and its derivatives, diphenoquinone derivatives, 8-hydroxyquinoline and its derivatives, etc. More specifically, similarly to the materials to form the hole-transporting layer, the materials to form electron-transporting layers may include substances disclosed in Japanese Unexamined Patent Application Publication No. 63-70257, 63-175860, 2-135359, 2-135361, 2-209988, 3-37992, and 3-152184. In particular, 2-(4-biphenylyl)-5-(4-t-butyl phenyl)-1, 3, 4-oxadiazole, benzoquinone, anthraquinone, and tris (8-quinolinol) aluminum are suitable.

Further, substances formed by mixing the material to form the hole-injecting layer (hole-transporting layer) or the material to form the electron-transporting layer to the material to form the light-emitting layer 14 may be used for the materials to form the light-emitting layer. In this case, the used quantity of the material to form the hole-transporting layer or the material to form the electron-transporting layer is different to each other according to the types of the used compounds, but the used quantity is properly set in consideration to the types of the used compounds within the range in which the capability for forming films and characteristics of light emitting are not deteriorated. Generally, the materials to form the light-emitting layer have 1 to 40 wt % and more preferably, 2 to 30 wt %.

Next, as shown in FIG. 11(*c*), the counter electrode 16 is formed as a cathode on the entire surface of the substrate 11 or in a stripe shape. As described above, the counter electrode 16 is formed by sequentially stacking the transparent layer 18 for transmitting the light and the reflective layers 19 for reflecting the light.

At this time, the film thickness of the transparent layer 18 is subject to change in each of the regions to which the light of three types of light-emitting layers corresponding to the three colors red, green, and blue is incident. The formation of these layers may be performed, for example, by a mask vapor deposition method. In other words, it is possible that the materials to form the cathode are deposited through the mask, and at the same time, the time period of deposition for each of the region are varied.

By the aforementioned processes, the organic EL elements and N type and P type driving circuit thin film transistors are completed.

Here, the aforementioned chemical formula (2) is as follows:

[Chemical Formula 1]

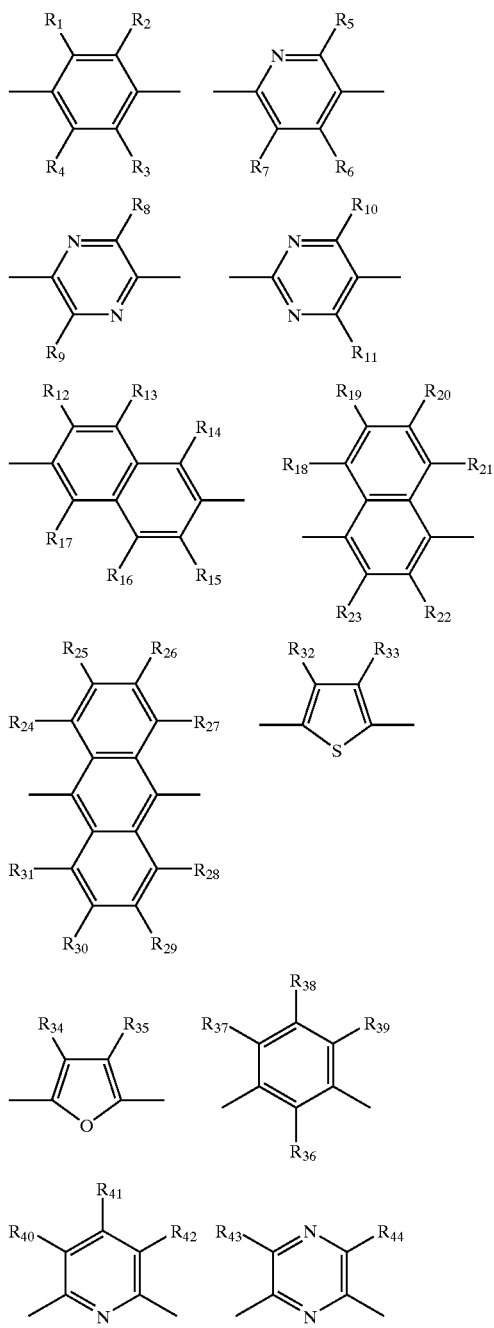
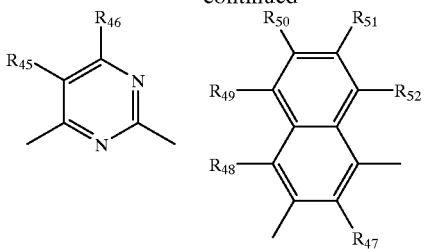
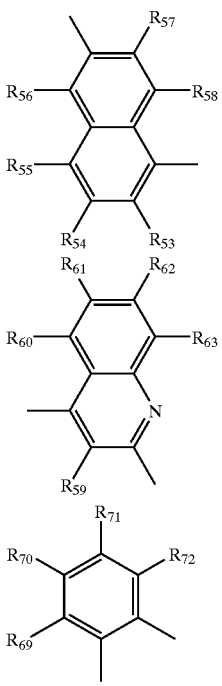
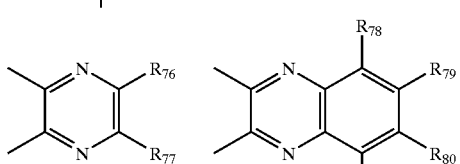
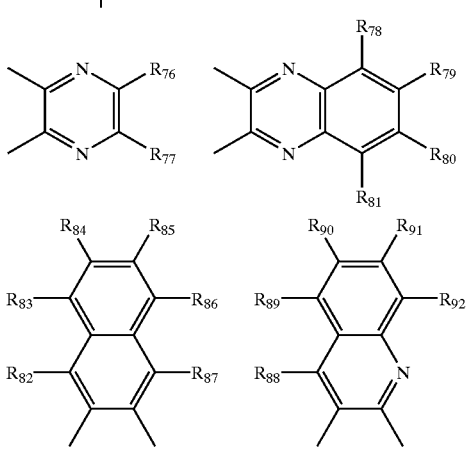

R1 to R92 independently represent radicals selected among a group comprising an alkyl radical, an alkoxy radical and an alkylthio radical having hydrogen and carbon number of 1 to 20; an aryl radical and an aryl oxy radical having carbon number of 6 to 18, and a heterocyclic compound radial having carbon number of 4 to 14.

A phenylene radical, a substituted phenylene radical, a biphenylene radical, a substituted biphenylene radical, a naphthalene diyl radical, a substituted naphthalene diyl radical, an anthracene-9,10-diyl radical, a substituted anthracene-9,10-diyl radical, a pyridine-2,5-diyl radical, a substituted pyridine-2,5-diyl radical, a thienylene radical and a substituted thienylene radical are preferable among them. A phenylene radical, a biphenylene radical, a naphthalene diyl radical, a pyridine-2,5-diyl radical, a thienylene radical are more preferable.

In the case that R and R' in chemical formula (1) are substituents other than hydrogen or a cyano radical, the alkyl radical having carbon number of 1 to 20 includes a methyl radical, an ethyl radical, a propyl radical, a butyl radical, a pentyl radical, a hexyl radical, a heptyl radical, an octyl radical, a decyl radical, and a lauryl radical, etc., and a methyl radical, an ethyl radical, a pentyl radical, a hexyl radical, a heptyl radical, and an octyl radical are preferable. The aryl radical includes, for example, a phenyl radical, a 4-C1 to C12 alkoxy phenyl radical (C1 to C12 is referred to carbon number of 1 to 12 and hereinafter it is the same as that), 4-C1 to C12 alkyl phenyl radical, a 1-naphthyl radical, and a 2-naphthyl radical, etc.

In view of solubility of a solvent, it is preferable that Ar in chemical formula (1) has one or more radicals selected among alkyl radicals, alkoxy radicals, and alkyl thio radicals having carbon number of 4 to 20, aryl radicals and aryl oxy radicals having carbon number of 6 to 18, and heterocyclic compound radicals having carbon number of 4 to 14, etc.

Examples of these substituents are illustrated below. The alkyl radicals having carbon number of 4 to 20 include a butyl radical, a pentyl radical, a hexyl radical, a heptyl radical, an octyl radical, a decyl radical, and a lauryl radical, etc., and a phentyl radical, a hexyl radical, a heptyl radical, and an octyl radical are preferable. Further, the alkoxy radicals having carbon number of 4 to 20 include a butoxy radical, a pentyloxy radical, a hexyloxy radical, a heptyloxy radical, an octyloxy radical, a decyloxy radical, and a lauryloxy radical, etc., and a pentyloxy radical, a hexyloxy radical, a heptyloxy radical, and an octyloxy radical are preferable. The alkyl thio radicals having carbon number of 4 to 20 include a butylthio radical, a pentylthio radical, a hexylthio radical, a heptylthio radical, an octylthio radical, a decyloxy radical, and a laurylthio radical, etc., and a pentylthio radical, a hexylthio radical, a heptylthio radical, an octylthio radical are preferable. The aryl radicals include a phenyl radical, a 4-C1 to C12 alkoxyphenyl radical, a 4-C1 to C12 alkylphenyl radical, a 1-naphthyl radical, and a 2-naphthyl radical, etc. The aryl oxy radicals include a phenoxy radical. The heterocyclic compound radicals include a 2-thienyl radical, a 2-pyrrolyl radical, a 2-furyl radical, and a 2-, 3- or 4-pyridyl radical, etc. The number of these substituents is different to each other according to the molecular weights of the polymer fluorescent substances and structures of the repeat units, but it is more preferable that there are one or more of the substituents per 600 molecular weights in view of obtaining a polymer fluorescent substance having high solubility.

Further, the polymer fluorescent substances may be random, block or graft copolymers, and the polymer fluorescent substances may be a polymer having intermediate structures thereof, which is for example, a block-like random copolymer. In view of obtaining a polymer fluorescent substances having high quantum efficiency of fluorescence, the block-like random copolymer and block or graft copolymers are more preferable than the perfect random copolymer. Further, since the organic electroluminescence elements formed herein uses fluorescence from thin films, the used polymer fluorescent substances have fluorescence in solid states.

In the case that solvents are used with the polymer fluorescent substances, the suitable solvent includes, for example, chloroform, methylene chloride, dichloroethane, tetrahydrofuran, toluene, and xylene, etc. Typically, 0.1 wt % or more of the polymer fluorescent substances can be dissolved in the solvents, according to the structures of the polymer fluorescent substances and their molecule weights.

Further, it is preferable that the molecule weights of the polymer fluorescent substances are 103 to 107 in terms of polystyrene. Their degrees of polymerization are varied according to their repeat structure or their ratios. In view of capability of forming films, generally, the total coefficient of the repeat structure is preferably 4 to 10000, more preferably 5 to 3000, and further more preferably 10 to 2000.

The method of synthesizing these polymer fluorescent substances is particularly not limited, but an exemplary method is a Witting reaction using diphosphonate which are obtained from a dialdehyde compound where two aldehyde radicals are bonded to an arylene radical, a compound where two halogenated methyl radicals are bonded to an arylene radical, and a tri-phenyl phosphine. Further, the other synthesizing methods include a dehalogenation hydrogen method using a compound where two halogenated methyl radicals are bonded to an arylene radical. Further, other synthesizing methods include a sulfonium salt decomposition method where a sulfonium salt of a compound, in which two halogenated methyl radicals are bonded to an arylene radical, is polymerized with an alkali, thereby obtaining an intermediate substance, and the obtained intermediate substance is thermally treated, thereby obtaining the aforementioned polymer fluorescent substance. Since in any synthesizing methods a compound having a skeleton other than arylene radicals is added as a monomer so as to change the structure of the repeat units contained in the generated polymer fluorescent substance by changing its existence ratio, it is possible to perform the copolymerization with an addition and reduction process such that the repeat units represented by chemical formula (1) is 50 mol % or more. Among the synthesizing methods, the method by using Wittig reaction is preferable in view of reaction control or yields.

More specifically, the method of synthesizing arylene vinyl based copolymer which is an example of the polymer fluorescent substances is described below. For example, in the case of obtaining the polymer fluorescent substances by using the Wittig reaction, the polymer fluorescent substance comprising a phenylene vinylene radical and a 2,5-dioctyloxy-p-phenylene vinylene radical is obtained by means of the Wittig reaction where for example, firstly a bis (halogenated methyl) compound, more specifically, for example, 2,5-dioctyloxy-p-xylylene dibromide is reacted with triphenylphosphine in an N,N-dimethyl formamide solvent, thereby synthesizing phosphonium salt, and the composite is condensed with a dialdehyde compound, more specifically, for example, terephthal aldehyde, for example in an ethyl alcohol by using lithium ethoxide. At that time, in order to obtain a copolymer, the two or more types of the diphosphonate and/or the two or more types of the dialdehyde compounds may be reacted.

In the case that these polymer fluorescent substances are used as materials to form the light-emitting layers, since their purities influence characteristics of light emitting, it is possible that a purification process such as fractionation by reprecipitation purification, chromatograph, etc., is carried out after the synthesis.

Further, as the materials to form the light-emitting layers made up of the polymer fluorescent substances, the materials to form the three colors red, green, and blue light-emitting layers to implement full color display are used.

Further, in case of forming the light-emitting layers, the material may be made of a host/guest based light-emitting material, that is, a light-emitting materials in which the guest material is added and dispersed into a host material.

In these light-emitting materials, for example, polymer organic compounds or low-molecule materials are suitably used as the host materials, and for example, materials including fluorescent colorants to change light emitting characteristics of the light-emitting layers or phosphorescent materials are suitably used as the guest materials.

As polymer organic compounds, in the case of a material having low solubility, it is possible that, for example, a precursor is applied and then thermally cured, as shown in the following chemical formula (3), thereby generating a light-emitting layer which is to be a polymer organic electroluminescence layer of a conjugated system. For example, sulfonium salt as a precursor is treated by heating so as to remove sulfonium radicals, thereby being a conjugated system polymer organic compound.

Further, in the case of a material having high solubility, it is possible that the material itself is applied and then solvents are removed, thereby being a light-emitting layer.

The polymer organic compounds have strong fluorescence in their solid states and are able to form homogeneous solid ultra thin films. Further, the polymer fluorescent substances have a large forming ability and thus high adherence to the ITO electrode, and if solidified, form robust conjugated system polymer films.

As these polymer organic compound, for example, polyarylene vinylene is preferable. The polyarylene vinylene is soluble in an aqueous solvent or an organic solvent, easily manufactured as an applying liquid for being applied to a second base substance 11, and since the polyarylene vinylene can be polymerized under certain conditions, it is possible to obtain thin films having high optical quality.

The polyarylene vinylene includes a PPV (poly(paraphenylene vinylene)) and PPV derivatives such as an MO-PPV (poly(2,5-dimethoxy-1,4-phenylen vinylene)), a CN—PPV (poly(2,5-bis hexyloxy-1,4-phenylene-(1-cyano vinylene))), an MEH-PPV (poly[2-methoxy-5-(2-ethyl hexyloxy)]-para-phenylene vinylene), etc., a poly(alkyl thiophene) such as a PTV (poly(2,5-thienylene vinylene)), etc., a PFV (poly(2,5-furylene vinylene)), a poly(paraphenylene), a polyalkyl fluorene, etc. Among them, materials including precursors of PPV or PPV derivatives as represented by chemical formula (4), a polyalkyl fluorene (more specifically, a polyalkyl fluorene system copolymer as represented by chemical formula (6)) as represented by chemical formula (5) are particularly preferable.

Since the PPV, etc., has strong fluorescence and is a conductive polymer whose π electrons to form double bonds are non-localized at polymer chains, it is possible to obtain organic electroluminescence element having high performance.

[Chemical Formula 2]

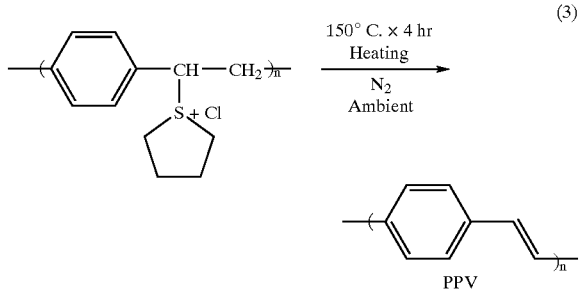

[Chemical Formula 3]

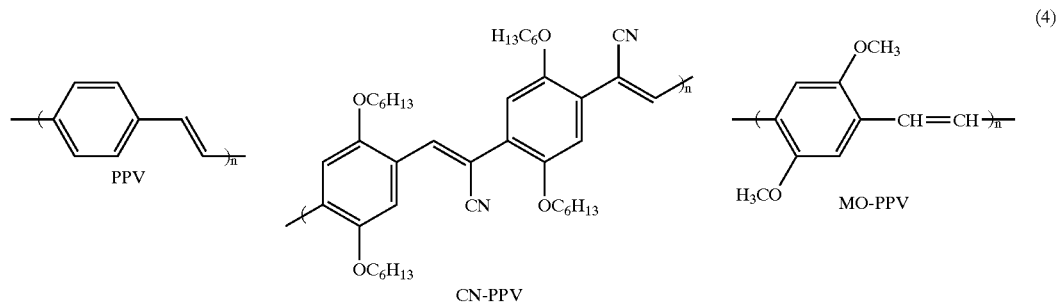

-continued
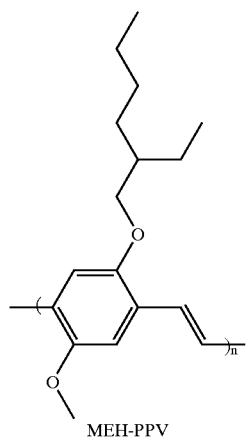
MEH-PPV
[Chemical Formula 4]
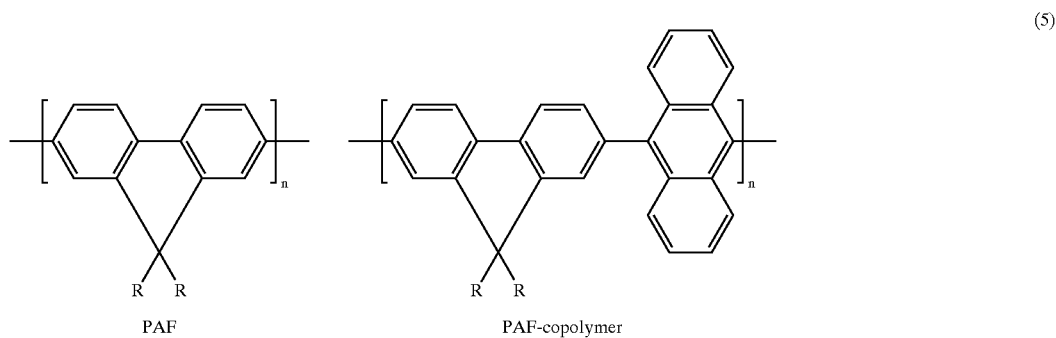
PAF          PAF-copolymer
(5)
[Chemical Formula 5]
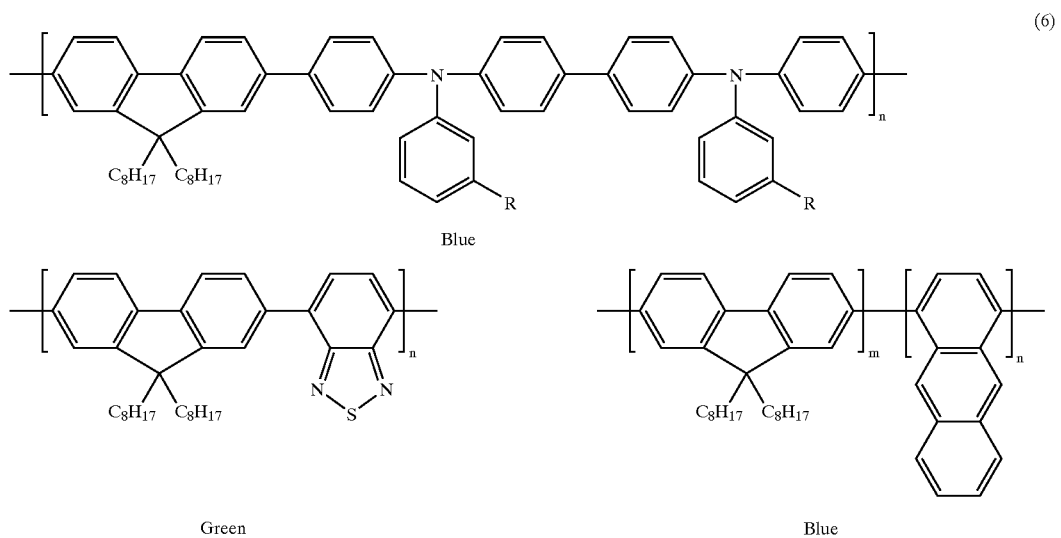
Blue
Green          Blue
(6)

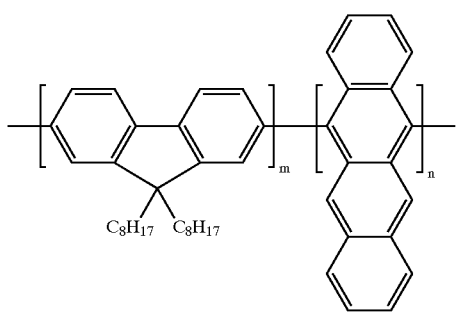

Green

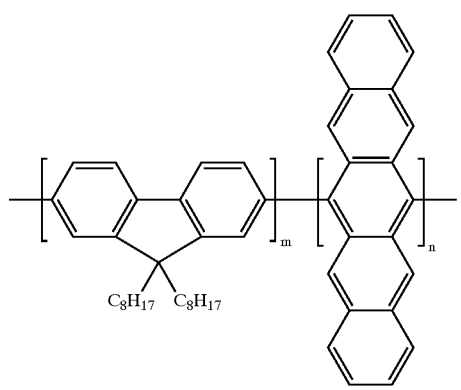

Red

Plolyfluorene Based Copolymer

Further, instead of the PPV thin films, the following materials may alternatively be used: a polymer organic compound which can form the light-emitting layer or a low-molecule material, that is a material used as a host material in the present invention including, for example, an alumiquinorinol complex (Alq3), distyrylbiphenyl, BeBq2 or ZN (OXZ)2 as represented by chemical formula (7) and materials generally used in the related art which are TPD, ALO, DPVBi, etc., a pyrazoline dimer, a quinolizine carboxylic acid, a benzo pyrylium perchlorate, a benzo pyranoquinolizine, a rubrene, a phenanthroline-europium complex, etc., and organic electroluminescence element composition comprising one type or two types or more of aforementioned materials.

[Chemical Formula 6]

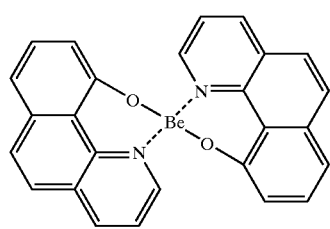

BeBg2

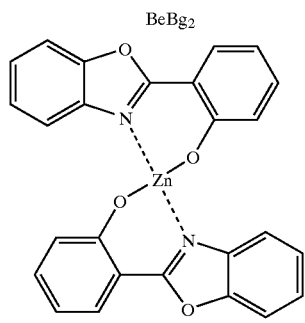

Zn(OXZ)2

(7)

On the other hand, the guest materials, which are added to these host materials, include fluorescent colorants and phosphorescent materials, as described above. In particular, the fluorescent colorants are able to change light emitting characteristics of the light-emitting layers and are effective means for improving light emitting efficiency of the light-emitting layers or for changing light absorption peak wavelength (light emitting color). In other words, the fluorescent colorants are not simply materials for the light-emitting layers, but the fluorescent colorants can be used as colorant materials to perform light emitting functions. For example, the exciton energy generated by carrier re-coupling on the conjugated system polymer organic compound molecule can be moved onto the fluorescent colorant molecules. In this case, since the light emitting is generated only from the fluorescent colorant molecules having high fluorescent quantum efficiency, the current quantum efficiency of the light-emitting layer is also increased. Therefore, the fluorescent colorants are added into the materials for forming the light-emitting layers, at the same time the light emitting spectrum of the light-emitting layer becomes that of the fluorescent molecules, so that it may be effective means for changing the light emitting color.

Further, the aforementioned current quantum efficiency is a criterion to measure the light emitting performance based on the light emitting function, and defined as follows.

$\eta E$=emitted photon energy/input electrical energy

Further, it is possible to emit, for example, three primary colors red, blue, and green by changing the light absorption peak wavelength due to doping of the fluorescent colorants, and as a result, it is possible to obtain a full color display substance.

Further, it is possible to largely enhance the light emitting efficiency of the organic electroluminescence elements by doping the fluorescent colorants.

In the case that the light-emitting layer for emitting the chromophoric light of red is formed, it is preferable that DCM-1 of a laser colorant, a rhodamine or rhodamine derivatives, phenylene, etc., is used as the fluorescent colorant. Although the light-emitting layers are able to be formed by doping these fluorescent colorants into the host material such as PPV, etc., since most of the fluorescent colorants are water-soluble, if the fluorescent colorants are doped to the sulfonium salt which is a PPV precursor having water-solubility, and after that, treated by heating, it is possible to form further uniform light-emitting layers. More specifically, these fluorescent colorants include rhodamine B, rhodamine B base, rhodamine 6G, or rhodamine 101 perchlorate, etc., and they may be mixture of at least two types thereof.

Further, in the case that the light-emitting layer to emit the chromophoric light of green is formed, it is preferable that a quinacridone, a rubrene, a DCJT, and their derivatives are used. Similarly to the aforementioned fluorescent colorants, although the light-emitting layers are able to be formed by doping these fluorescent colorants to the host materials, such as PPV, etc., since most of the fluorescent colorants are water-soluble, if the fluorescent colorants are doped to the sulfonium salt which is a PPV precursor having water-solubility, and after that, treated by heating, it is possible to form further uniform light-emitting layers.

Further, in the case that the light-emitting layer to emit the chromophoric light of blue is formed, it is preferable that a distyryl biphenyl and its derivatives are used. Similarly to the aforementioned fluorescent colorants, although the light-emitting layers are able to be formed by doping these fluorescent colorants to the host materials such as PPV, etc., since most of the fluorescent colorants are water-soluble, if the fluorescent colorants are doped to the sulfonium salt which is a PPV precursor having water-solubility, and after that, treated by heating, it is possible to form further uniform light-emitting layers.

Further, the other fluorescent colorants having chromophoric light of blue include a coumarine and its derivatives. These fluorescent colorants have good compatibility to PPV, and are easily used to form a light-emitting layer. In particular, the coumarine itself among the fluorescent colorants is insoluble in the solvent, but if appropriate substituents are selected, the solubility of the coumarine is increased, it may be soluble to a solvent. More specifically, these fluorescent colorants include coumarine-1, coumarine-6, coumarine-7, coumarine 120, coumarine 138, coumarine 152, coumarine 153, coumarine 311, coumarine 314, coumarine 334, coumarine 337, coumarine 343, etc.

Further, the other fluorescent colorants having chromophoric light of blue include a tetraphenyl butadiene (TPB), TPB derivatives, DPVBi, etc. Similarly to the red fluorescent colorant, these fluorescent colorants are soluble to an aqueous solution and have good compatibility to PPV, and are easily used to form light-emitting layers.

In the aforementioned fluorescent colorants, only one type fluorescent colorant or mixture of at least two types of fluorescent colorants may be used for each color.

Further, fluorescent colorants as represented by chemical formula (8), fluorescent colorants as represented by chemical formula (9), and fluorescent colorants as represented by chemical formula (10) are used as these fluorescent colorants.

[Chemical Formula 7]

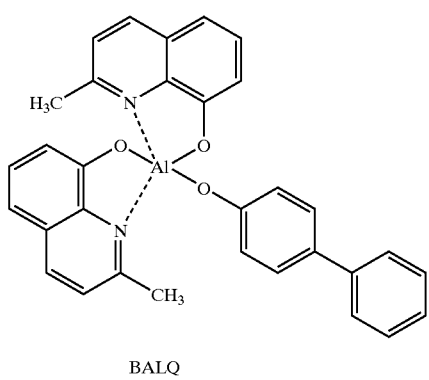

BALQ

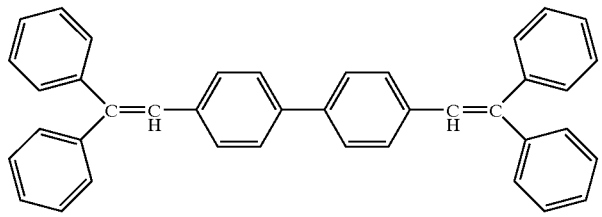

DSA (8)

[Chemical Formula 8]

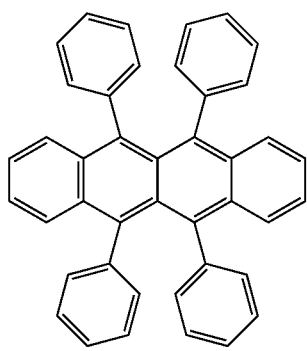

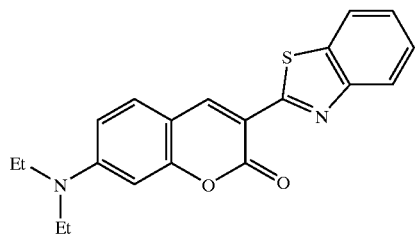

(9)

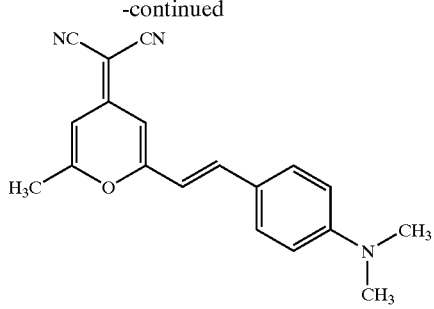
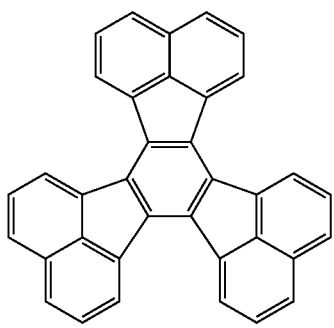
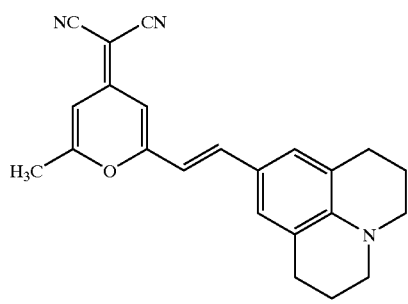
[Chemical Formula 9]
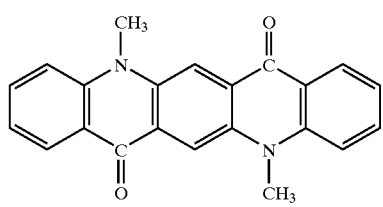
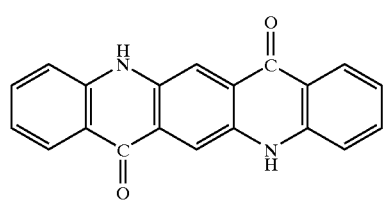
(10)
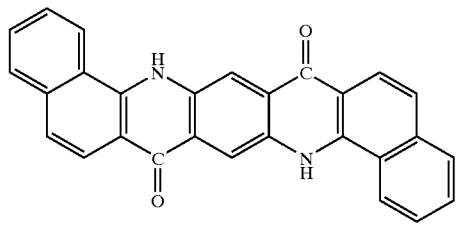
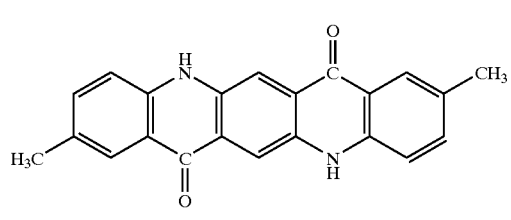
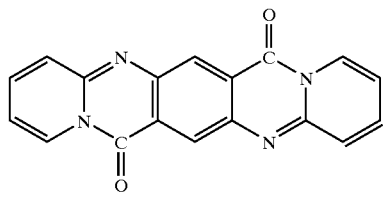
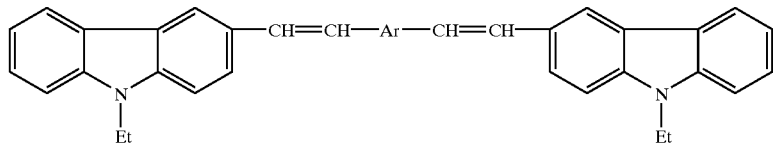
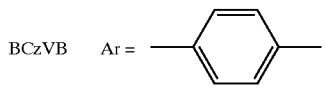
BCzVB  Ar =
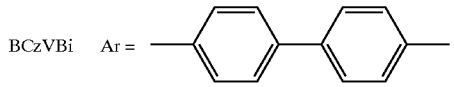
BCzVBi  Ar =

It is preferable that these fluorescent colorants be added to the host material made up of the aforementioned conjugated system polymer organic compound in 0.5 to 10 wt % of the fluorescent colorants, and more preferably in 1.0 to 5.0 wt % thereof by a method as described below. The reason is that if the added quantity of the fluorescent colorants is too large, it is difficult to preserve the weatherability and the durability of the light-emitting layer, and on the other hand, if the added quantity is too small, it is difficult to sufficiently obtain the aforementioned effects due to the adding of the fluorescent colorants.

Further, Ir (ppy)3, Pt (thpy)2, PtOEP, etc., represented by chemical formula (11) are suitably used as phosphorescent materials which are guest materials which are added to the host materials.

[Chemical Formula 10]

(11)

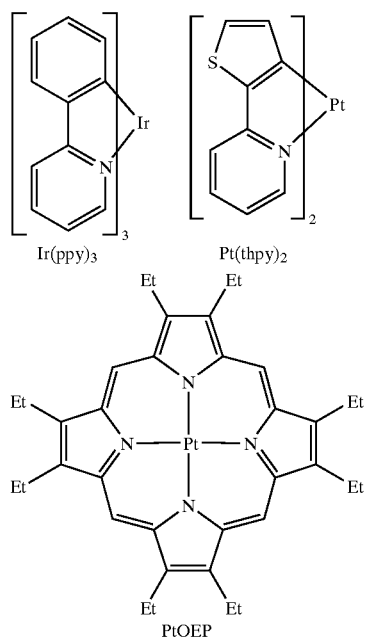

Further, in case of using the phosphorescent materials represented by chemical formula 11 as guest materials, particularly CBP, DCTA, TCPB represented by chemical formula 12 or aforementioned DPVBi and Alq3 are suitably used as the host materials.

Further, the fluorescent colorants and phosphorescent materials, as guest materials, may be added to the host material.

[Chemical Formula 11]

(12)

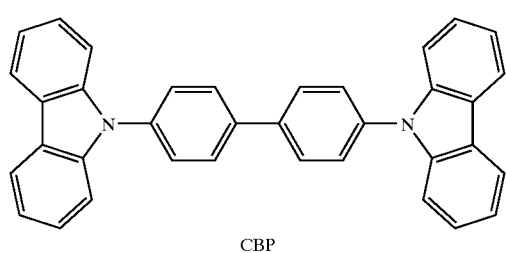

CBP

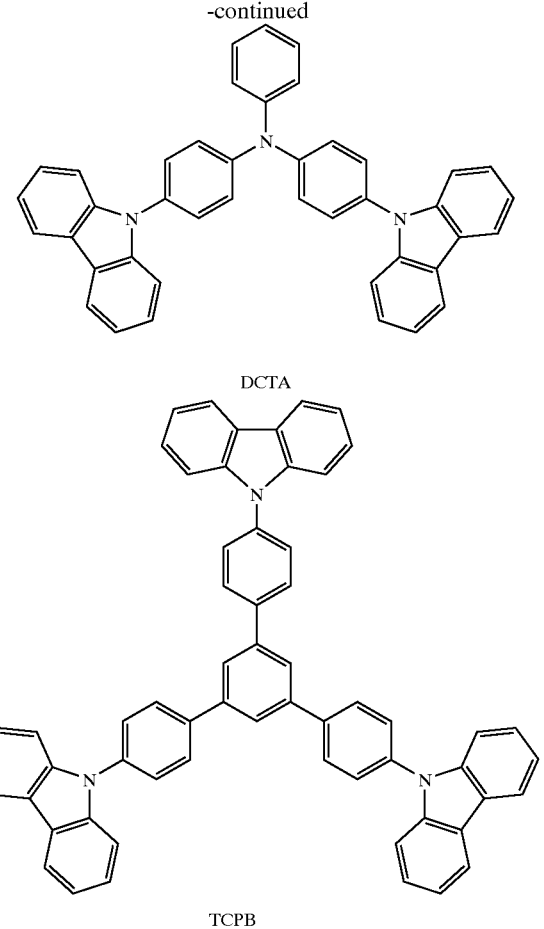

DCTA

TCPB

Further, in the case that the aforementioned light-emitting layers are formed by using these host/guest based light-emitting materials, it is possible to form the light-emitting layers by use of light-emitting materials in which desired quantity of the guest material is added to the host materials by simultaneously ejecting the host material and the guest material in predetermined quantity ratios.

Further, although a hole-transporting layer is formed as the lower layer of the light-emitting layers and a electron-transporting layer is formed as the upper layer of the light-emitting layers in the aforementioned exemplary embodiment, the present invention is not limited to the embodiment, but for example, the only one of the hole-transporting layer and the electron-transporting layer may be formed or the hole-injecting layer may be formed in place of the hole-transporting layer. Also, the only light-emitting layer may be formed.

It may be possible to lengthen life time of the light-emitting layers by forming, for example, on the counter electrode side of the light-emitting layers, a hole-blocking layer in addition to the hole-injecting layer, the hole-transporting layer, the light-emitting layer, and the electron-transporting layer. The material to form the hole-blocking layer includes, for example, a BCP represented by chemical formula (13) or BAlq represented by chemical formula (14). In view of lengthening the life time, the BAlq is more preferable.

[Chemical Formula 12]

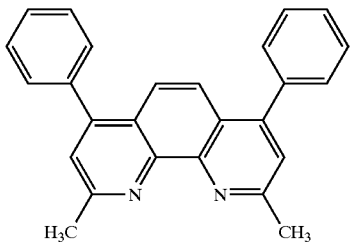

BCP
(13)

[Chemical Formula 9]

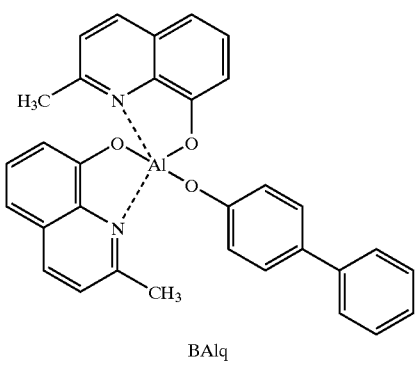

BAlq
(14)

FIGS. 12 to 17 illustrate exemplary embodiments of electronic apparatuses according to the present invention.

Electronic apparatuses of the present exemplary embodiment include a light-emitting device, such as the aforementioned organic EL display device usable as a display device.

FIG. 12 illustrates an example of a display device to display a television image, or a text or an image which is transmitted to a computer. In FIG. 12, reference numeral 1000 denotes the main body of the display device for which the light-emitting device of the present invention is used. Further, the main body 1000 of the display device can be adapted to large screen by using the aforementioned organic EL display device.

Further, FIG. 13 illustrates an example of an in-car navigation device. In FIG. 13, reference numeral 1010 denotes the main body of the navigation device, and reference numeral 1011 denotes the display portion (display means) for which the light-emitting device of the present invention is used.

Further, FIG. 14 illustrates an example of a portable image recording device (video camera). In FIG. 14, reference numeral 1020 denotes the main body of the recording device, and reference numeral 1021 denotes the display portion for which the light-emitting device of the present invention is used.

Further, FIG. 15 illustrates an example of a mobile phone. In FIG. 15, reference numeral 1030 denotes the main body of the mobile phone, and reference numeral 1031 denotes the display portion (display means) for which the light-emitting device of the present invention is used.

Further, FIG. 16 illustrates an example of an information processing apparatus, such as a word processor, a PC, etc., for example. In FIG. 16, reference numeral 1040 denotes the information processing apparatus, reference numeral 1041 denotes the main body of the information processing apparatus, and reference numeral 1042 denotes an input portion, such as a keyboard, etc., and reference numeral 1043 denotes the display portion for which the light-emitting device of the present invention is used.

Further, FIG. 17 illustrates an example of a wrist watch type electronic apparatus. In FIG. 17, reference numeral 1050 denotes the main body of the watch, and reference numeral 1051 denotes the display portion for which the light-emitting device of the present invention is used.

The electronic apparatuses, as shown in FIGS. 12 to 17, include the light-emitting device of the present invention as a display device, so that it is possible to enhance or optimize the chromaticity of the light and to obtain good display quality.

Although the above exemplary embodiments of the present invention are described with reference to the accompanying drawings, the present invention is not limited to the above exemplary embodiments. Various shapes or combinations of the components illustrated in the aforementioned exemplary embodiments are only examples, and therefore various variations can be made in accordance with design requirements within a scope not departing from the principle of the present invention.

According to the light-emitting device of the present invention, since the film thicknesses of the electrode layers on which the light from the light-emitting layers is incident are set, it is possible to enhance or optimize the chromaticity of the light.

Further, according to method of manufacturing a light-emitting device of the present invention, it is possible to manufacture a light-emitting device whose chromaticity of the light is enhanced or optimized.

Further, according to an electronic apparatus of the present invention, since the electronic apparatus comprises the light-emitting device whose chromaticity of the light is enhanced or optimized, it is possible to enhance the display performance.

What is claimed is:

1. A light-emitting device, comprising:
a first electrode;
a light-emitting layer disposed above the first electrode;
a second electrode disposed above the light-emitting layer; and
a material layer disposed above the second electrode,
the first electrode including both a transparent layer to transmit the light from the light-emitting layer and a reflective layer to reflect the light, and
the thickness of the light-emitting layer and the transparent layer being set so that light extracted through at least the material layer out of light emitted in the light-emitting layer has a predetermined chromaticity value.

2. An organic EL device, comprising:
a first electrode;
an organic EL layer disposed above the first electrode;
a second electrode disposed above the organic EL layer; and
a material layer disposed above the second electrode,
the first electrode layer including a transparent layer to transmit the light from the organic EL layer and a reflective layer to reflect the light, and
the thicknesses of the organic EL layer and the transparent layer being set so that light extracted through at least the material layer out of light emitted in the organic EL layer has a predetermined chromaticity value.

3. An electronic apparatus, comprising:
the light-emitting device according to claim 1.

4. A method of manufacturing a light-emitting device, comprising:
disposing a first electrode including a transparent layer and a reflective layer above a substrate;
disposing a light-emitting layer above the first electrode;
disposing a second electrode above the light-emitting layer;
disposing a material layer above the second electrode to cover the light-emitting layer; and
setting the thickness of the transparent layer so that light extracted through at least the material layer out of light emitted in the light-emitting layer has a predetermined chromaticity value.

5. A method of manufacturing a light-emitting device, comprising:
disposing a plurality of light-emitting layers including three types of light-emitting layers corresponding to the three colors red, green, and blue;
disposing a plurality of electrode layers above the light-emitting layers;
disposing a material layer above the electrode layers to cover the light-emitting layers; and
individually setting the thicknesses of the electrode layers to correspond to the regions on which light from the three types of light-emitting layers is incident.

6. The method of manufacturing a light-emitting device according to claim 5, further comprising:
disposing the three types of light-emitting layers by using mask vapor deposition.

7. A light-emitting device, comprising:
a first electrode;
a second electrode;
a third electrode;
a fourth electrode;
a first light-emitting layer disposed between the first electrode and second electrode; and
a second light-emitting layer disposed between the third electrode and fourth electrode,
the first electrode and the third electrode each including both a transparent layer to transmit the light from the light-emitting layer and a reflective layer to reflect the light,
the first light-emitting layer and the second light-emitting layer emitting different color light, and
the thicknesses of the transparent layer of the first electrode and the first light-emitting layer being different from that of the transparent layer of the third electrode and the second light-emitting layer.

8. A light-emitting device, comprising:
a first electrode;
a first light-emitting layer disposed above the first electrode;
a second electrode disposed above the first light-emitting layer;
a third electrode;
a second light-emitting layer disposed above the third electrode;
a fourth electrode disposed above the second light-emitting layer; and
a material layer disposed above both the second electrode and the fourth electrode,
the first electrode and the third electrode each including both a transparent layer to transmit the light from the light-emitting layers and a reflective layer to reflect the light,
the light emitted in the light-emitting layers being extracted through the material layer,
the first light-emitting layer and the second light-emitting layer emitting different color light, and
the thicknesses of the transparent layer of the first electrode and the first light-emitting layer being different from that of the transparent layer of the third electrode and the second light-emitting layer.

9. A light-emitting device, comprising:
a substrate;
a first electrode disposed above the substrate;
a first light-emitting layer disposed above the first electrode;
a second electrode disposed above the first light-emitting layer;
a third electrode disposed above the substrate;
a second light-emitting layer disposed above the third electrode; and
a fourth electrode disposed above the second light-emitting layer,
the second electrode and the fourth electrode each including both a transparent layer to transmit the light from the light-emitting layers and a reflective layer to reflect the light,
the light emitted in the light-emitting layers being extracted through the substrate,
the first light-emitting layer and the second light-emitting layer emitting different color light, and
the thicknesses of the transparent layer of the second electrode and the first light-emitting layer being different from that of the transparent layer of the fourth electrode and the second light-emitting layer.

* * * * *